(12) United States Patent  
Furuta et al.

(10) Patent No.: US 8,410,374 B2
(45) Date of Patent: Apr. 2, 2013

(54) PRINTED WIRING BOARD

(75) Inventors: Toru Furuta, Ogaki (JP); Kotaro Takagi, Ogaki (JP); Michio Ido, Ogaki (JP); Fumitaka Takagi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 194 days.

(21) Appl. No.: 12/582,050

(22) Filed: Oct. 20, 2009

(65) Prior Publication Data

US 2010/0218980 A1 Sep. 2, 2010

Related U.S. Application Data

(60) Provisional application No. 61/156,095, filed on Feb. 27, 2009.

(51) Int. Cl.
*H05K 1/11* (2006.01)

(52) U.S. Cl. ......... 174/257; 174/250; 174/260; 174/261

(58) Field of Classification Search .................. 174/257, 174/261, 250, 260, 263, 256, 258; 257/734; 438/614

See application file for complete search history.

(56) References Cited

U.S. PATENT DOCUMENTS

| 5,227,012 | A | * | 7/1993 | Brandli et al. ................... 216/16 |
| 5,503,286 | A | * | 4/1996 | Nye et al. ......................... 216/13 |
| 5,903,056 | A | * | 5/1999 | Canning et al. ............... 257/773 |
| 6,225,569 | B1 | * | 5/2001 | Hashimoto et al. .......... 174/260 |
| 6,472,609 | B2 | * | 10/2002 | Wakimoto et al. ............. 174/255 |
| 6,591,495 | B2 | * | 7/2003 | Hirose et al. ................... 29/846 |
| 7,535,095 | B1 | * | 5/2009 | En et al. ....................... 257/701 |
| RE40,947 | E | * | 10/2009 | Asai et al. ..................... 428/209 |
| 7,985,930 | B2 | * | 7/2011 | Asai et al. ..................... 174/264 |
| 2008/0289864 | A1 | * | 11/2008 | En et al. ........................ 174/257 |

FOREIGN PATENT DOCUMENTS

JP 2003-197673 7/2003

* cited by examiner

*Primary Examiner* — Angel R Estrada
*Assistant Examiner* — Dimary Lopez
(74) *Attorney, Agent, or Firm* — Oblon, Spivak, McClelland, Maier & Neustadt, L.L.P.

(57) ABSTRACT

A printed wiring board has an insulative board having a first surface and a second surface on the opposite side of the first surface, a wiring formed on the first surface of the insulative board and having a pad and a conductive circuit contiguous to the pad, and a metal film formed on the pad. The pad is provided to mount an electronic component having a gold bump. The pad has a thickness which is greater than a thickness of the conductive circuit.

10 Claims, 20 Drawing Sheets

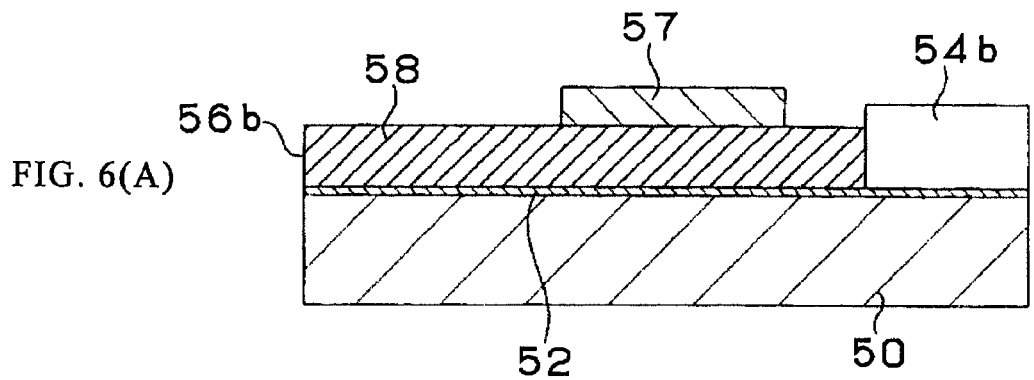
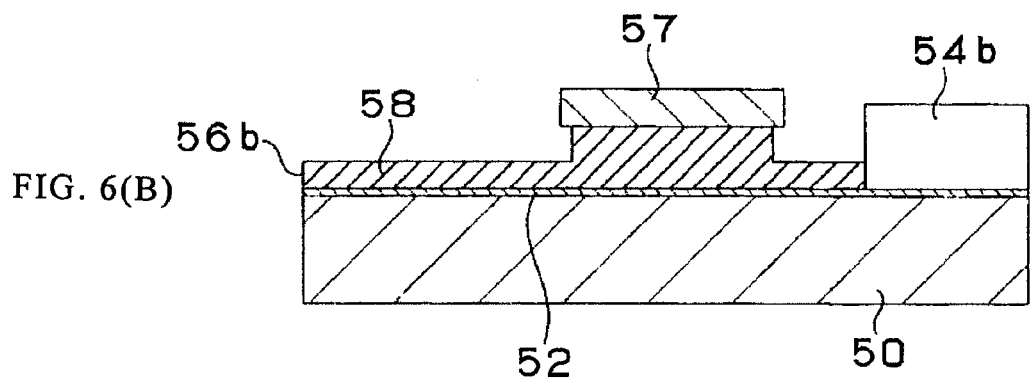
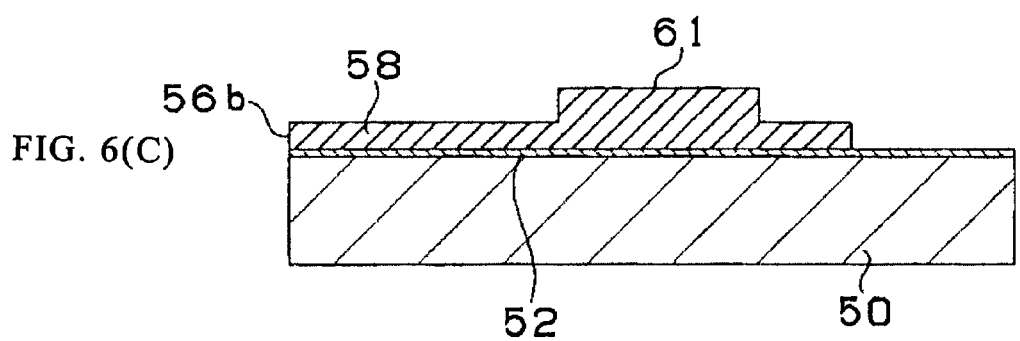
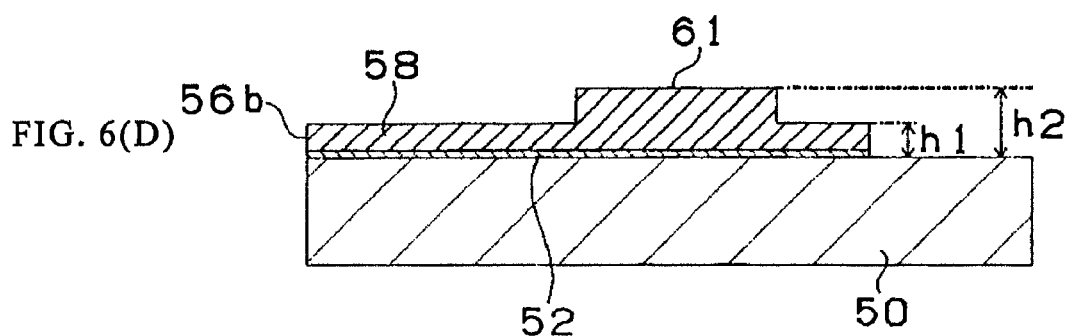

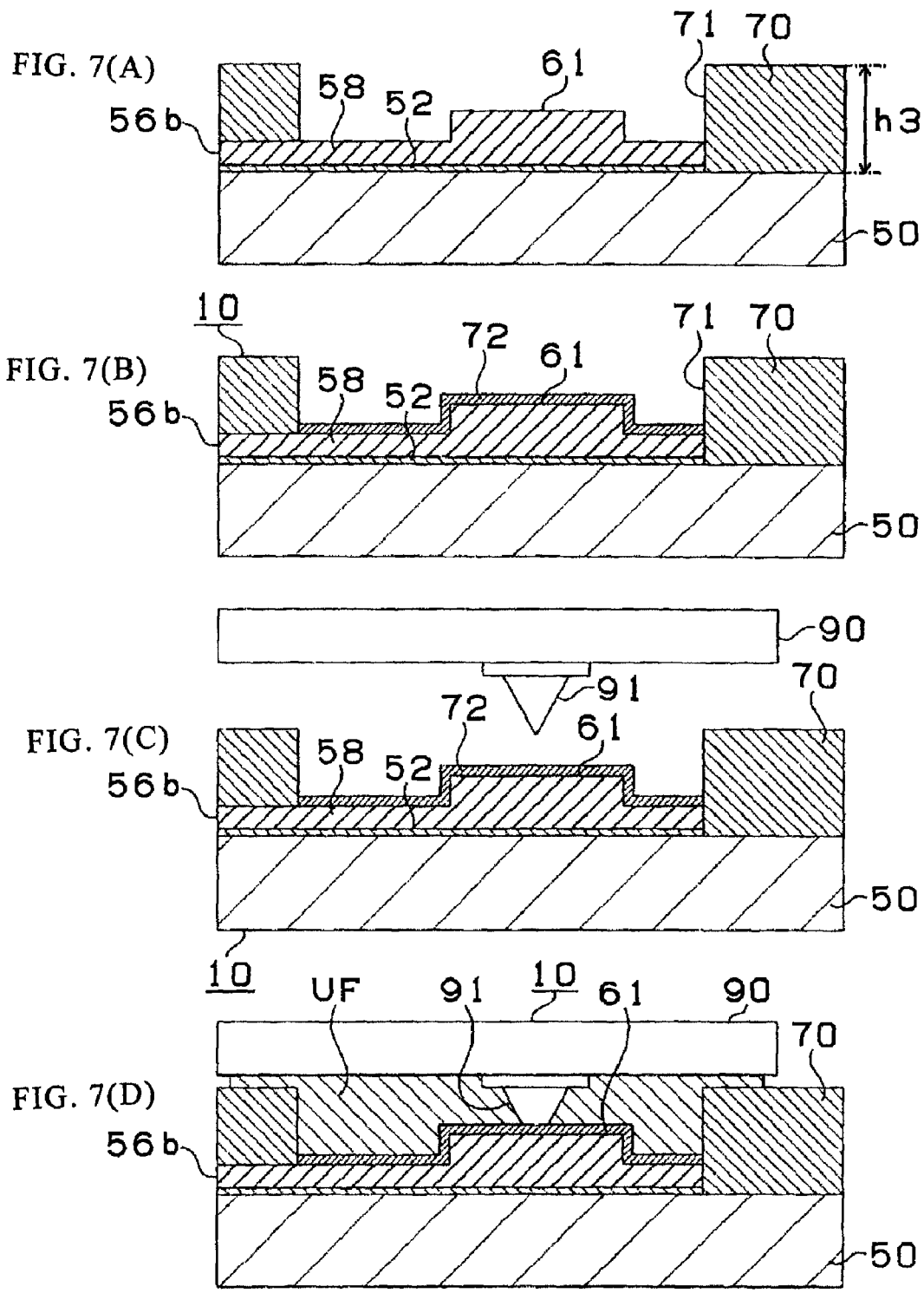

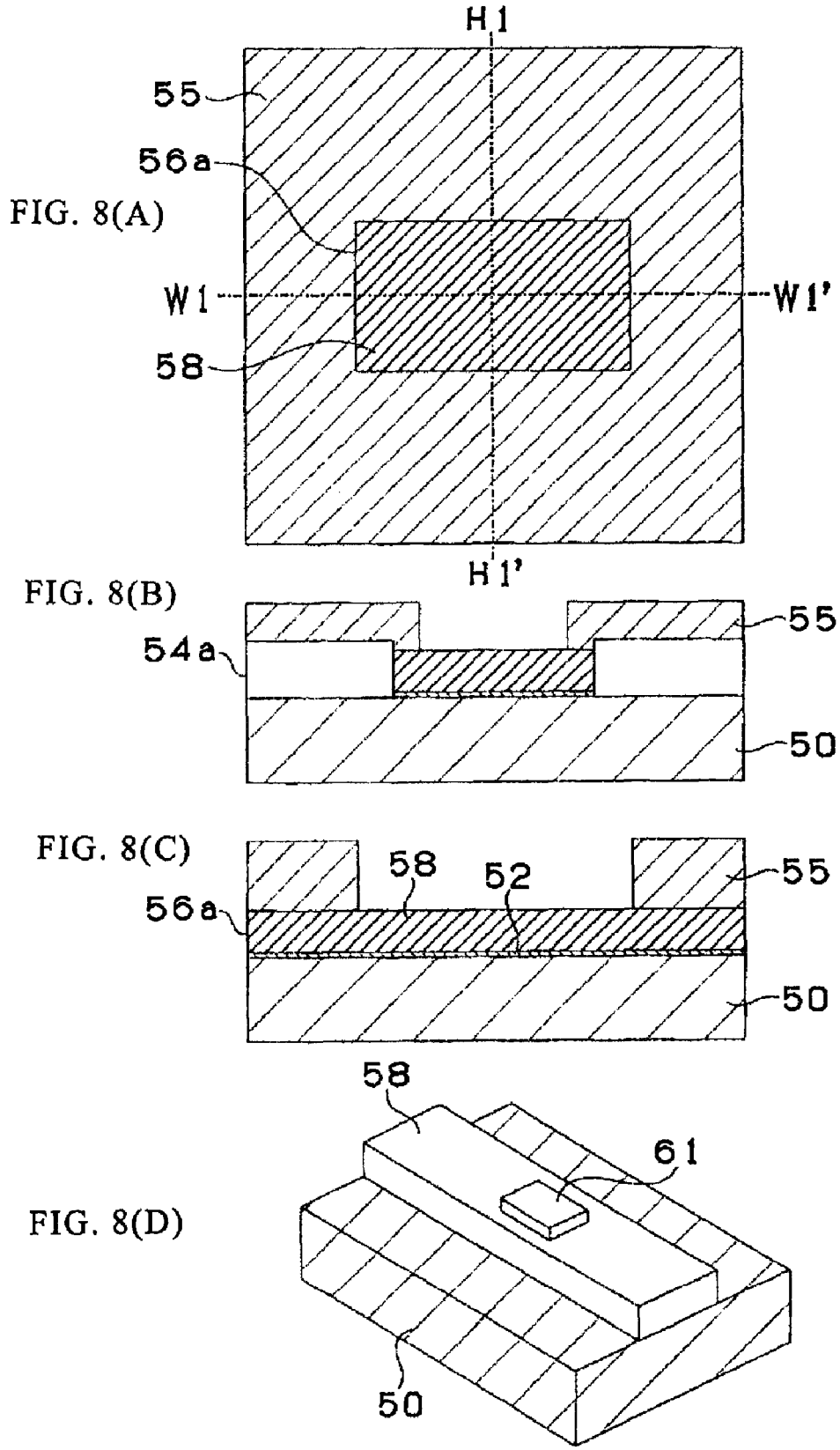

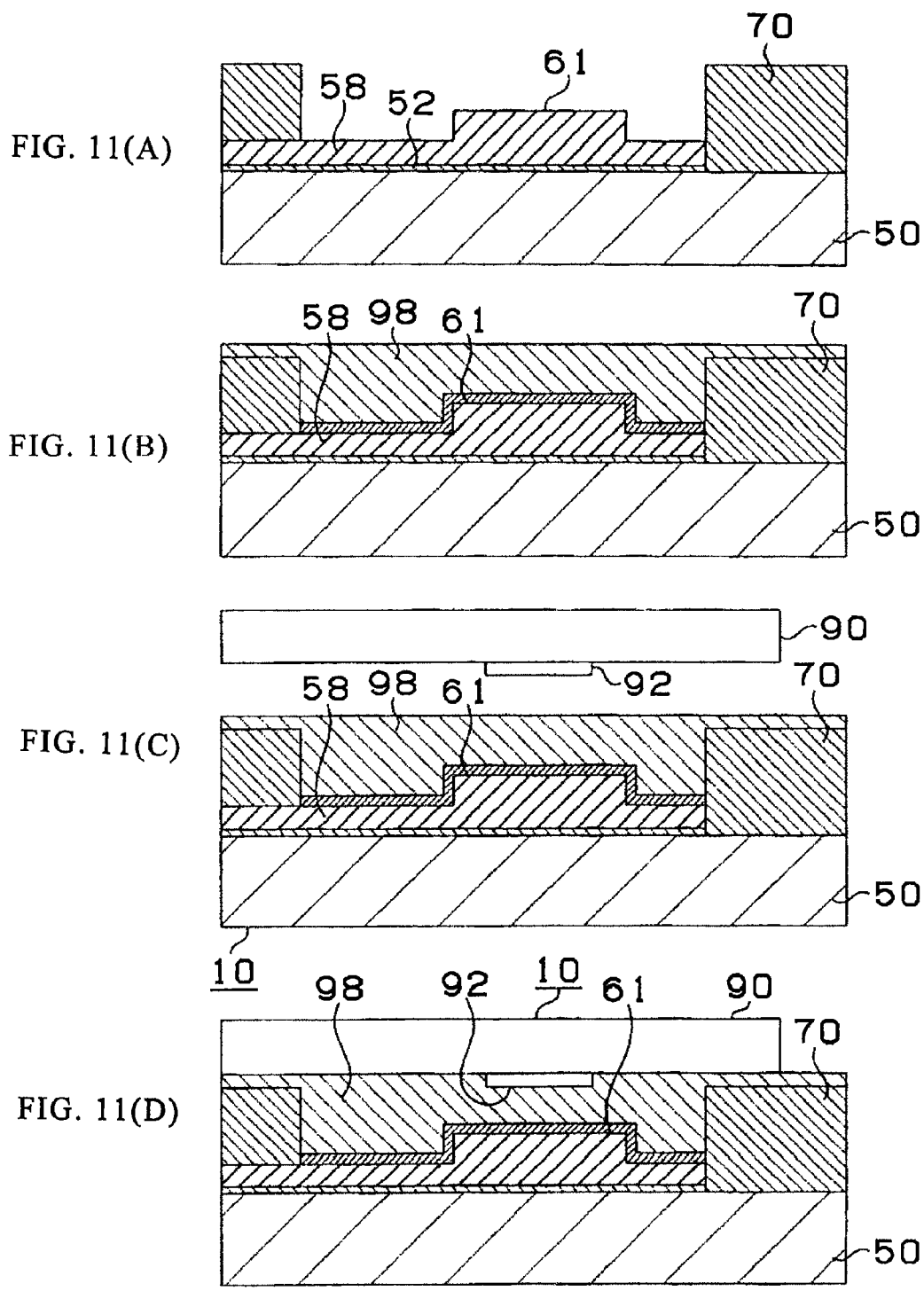

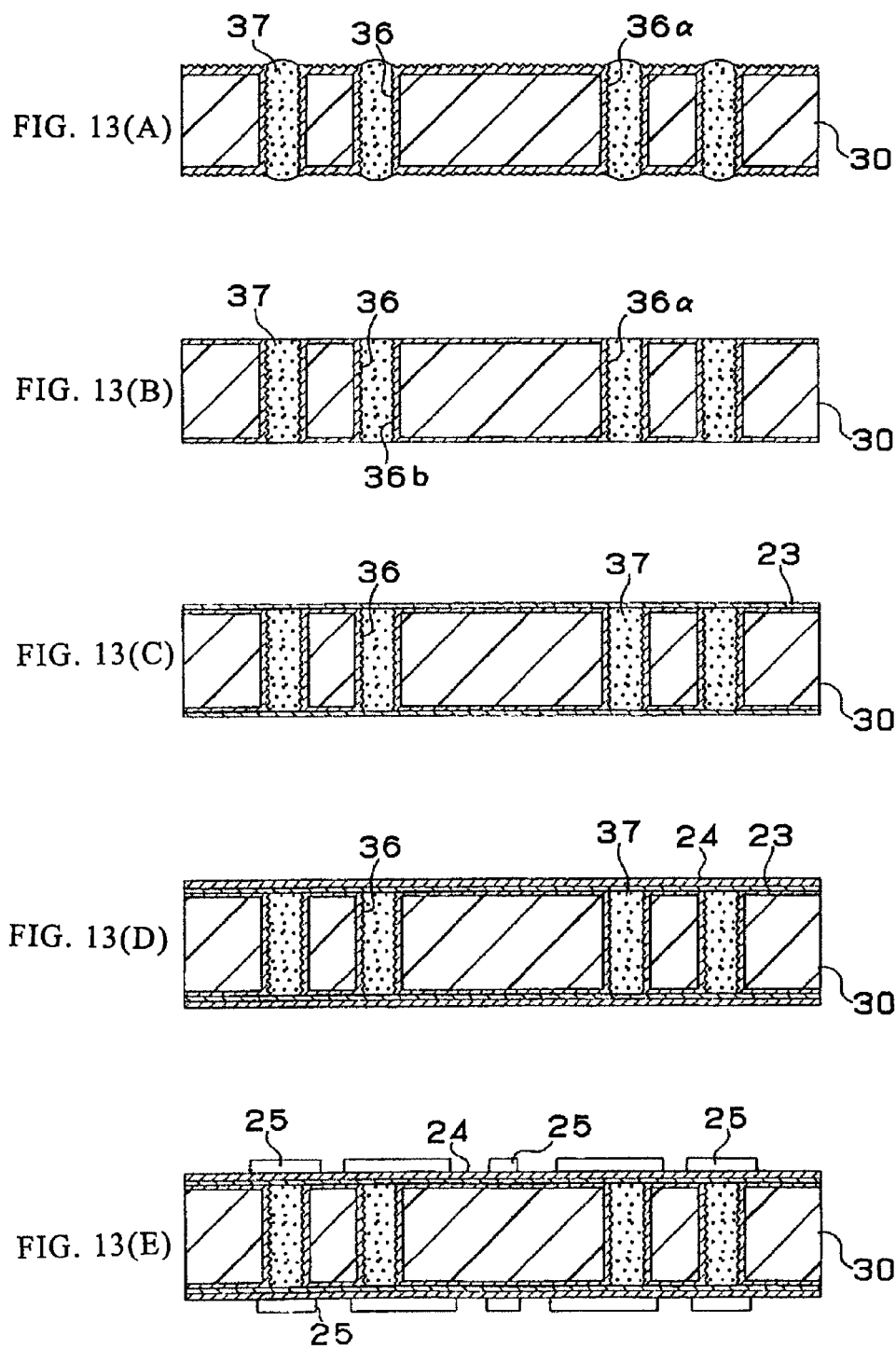

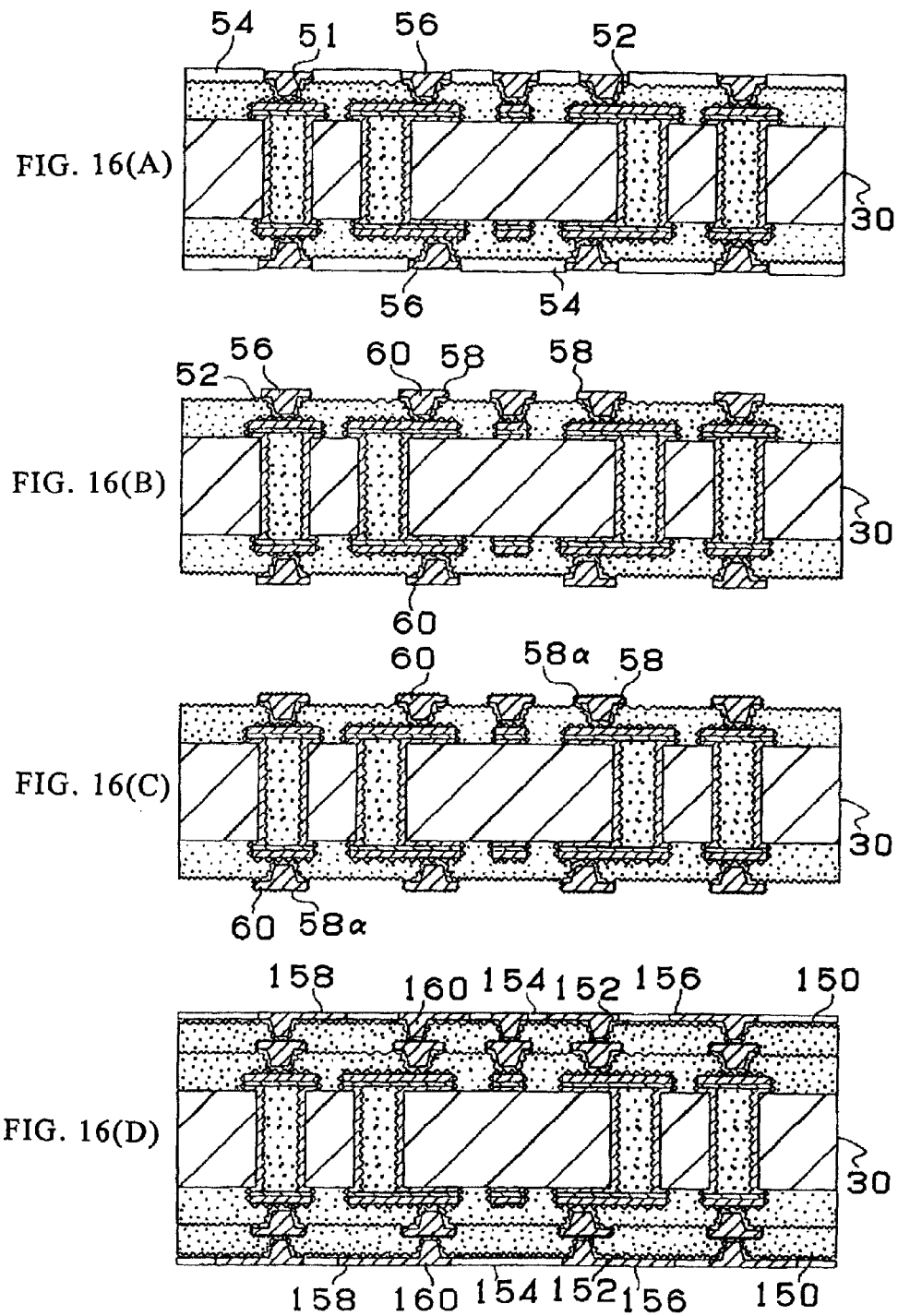

PRINTED WIRING BOARD

CROSS-REFERENCE TO RELATED APPLICATIONS

The present application claims the benefits of priority to U.S. Application No. 61/156,095, filed Feb. 27, 2009. The contents of that application are incorporated herein by reference in their entirety.

BACKGROUND OF THE INVENTION

1. Field of the Invention

The present invention is related to a method for manufacturing a printed wiring board on which to mount an electronic component such as an IC chip; especially to a method for manufacturing a printed wiring board having a pad to make an Au—Au connection or a connection using anisotropic conductive film with an electrode such as a gold-stud bump of an electronic component.

2. Discussion of the Background

In Japanese Laid-Open Patent Publication 2003-197673, the content of which are incorporated herein by reference in their entirety, a semiconductor device is described in which a gold-stud bump formed in an Si substrate is connected to a metal-coated pad of a printed wiring board. In Japanese Laid-Open Patent Publication 2003-197673, conductive wiring is coated with a resist film, and a plated-metal film made of Ni—P/Au is formed on the surface of a chip-connection terminal and connected to an Au bump (gold-stud bump) of the Si substrate.

SUMMARY OF THE INVENTION

A printed wiring board according to one aspect of the present invention has an insulative board having a first surface and a second surface opposite the first surface; wiring formed on the first surface of the insulative board and made up of a pad for mounting an electronic component having a gold bump and of a conductive circuit contiguous to the pad; and a metal film formed on the pad. In such a printed wiring board, the thickness of the pad is greater than the thickness of the conductive circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 are views showing the steps of a method for manufacturing a printed wiring board according to the second embodiment;

FIG. 7 are views showing the steps of a method for manufacturing a printed wiring board according to the second embodiment;

FIG. 8 are a top view and cross-sectional views showing a modified example of the multilayer printed wiring board according to the first embodiment;

FIG. 11 are views showing the steps of a method for manufacturing a printed wiring board according to the third embodiment;

FIG. 13 are views showing the steps of a method for manufacturing a multilayer printed wiring board according to the first example of the present invention;

FIG. 16 are views showing the steps of a method for manufacturing a multilayer printed wiring board according to the first example of the present invention;

DETAILED DESCRIPTION OF THE EMBODIMENTS

Figure 1A:
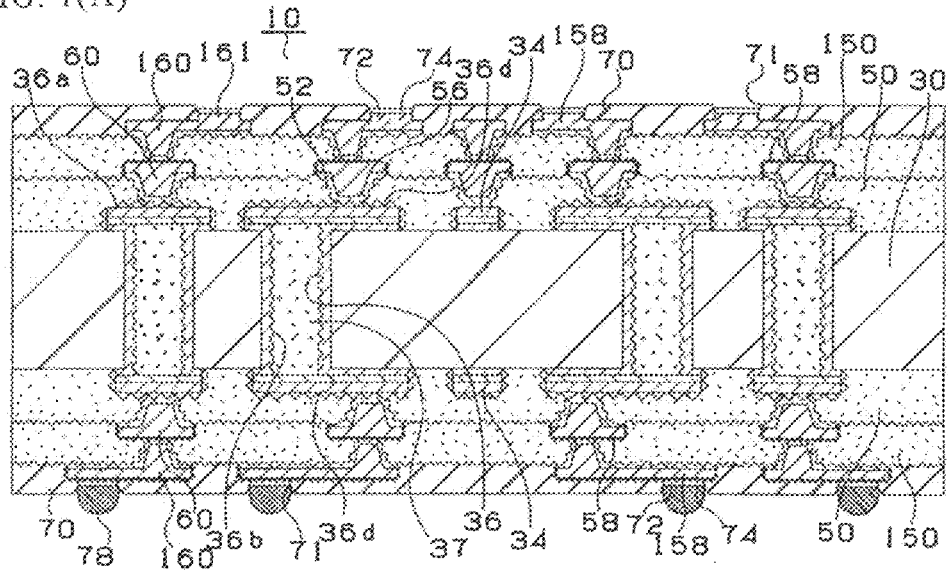
FIG. 1 are cross-sectional views and a top view of a multilayer printed wiring board according to an embodiment of the present invention.

The embodiments will now be described with reference to the accompanying drawings, wherein like reference numerals designate corresponding or identical elements throughout the various drawings.

Embodiments

First Embodiment

The structure of a printed wiring board according to an embodiment of the present invention is described with reference to FIGS. 1A-1D. FIG. 1A is a cross-sectional view showing multilayer printed wiring board 10. In multilayer printed wiring board 10, conductive circuits 34 are formed on the surfaces of core substrate 30. The front and back surfaces of core substrate 30 are connected by means of through-holes 36. Through-holes 36 are made up of plated cover layers (36a, 36d) which form through-hole lands and of side-wall conductive layers (36b). In the interiors surrounded by side-wall conductive layers (36b), resin filler 37 is filled. Resin insulation layers 50 having filled vias 60 and conductive circuits 58 and resin insulation layers 150 having filled vias 160 and conductive circuits 158 are formed on plated cover layers (through-hole lands) (36a, 36d). Pads 161 are formed at predetermined spots of upper-side conductive circuits 158. Solder-resist layers 70 are formed on resin insulation layers 150. Part of conductive circuits 158 and pads 161 are exposed through opening portions 71 of upper-side solder-resist layer 70; and bumps 78 are formed in lower-side opening portions 71.

Figure 1B:
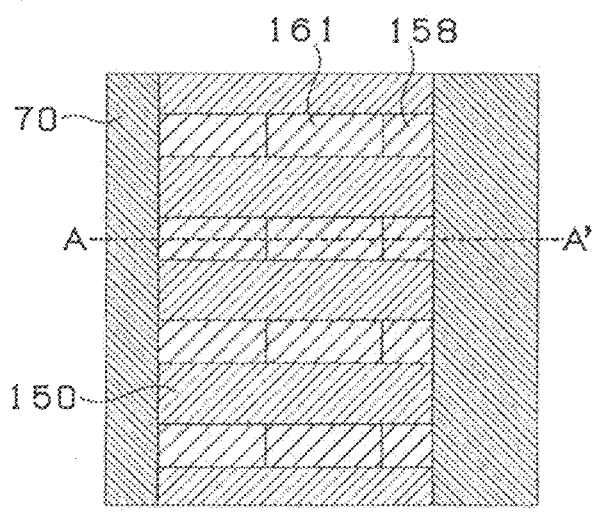
Figure 1C:
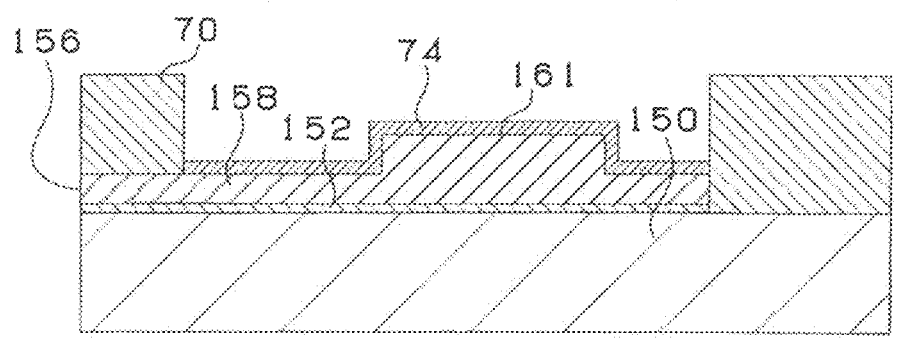

FIG. 1B is a magnified top view showing part of multilayer printed wiring board 10. FIG. 1C is a cross-sectional view seen from the (A-A') line in FIG. 1B. The thickness of pad 161 is set to be greater than the thickness of conductive circuit 158, preferably approximately 2-10 μm thicker. Pad 161 is used for electrically connecting the wiring board and an electronic component such as a semiconductor chip. Metal film 74 such as Au is coated on the pad surface according to requirements.

Next, a method for manufacturing printed wiring board 10 according to the first embodiment of the present invention is described with reference to FIGS. 2-4.

Figure 2A:
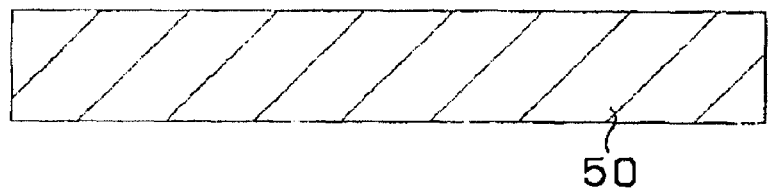
FIG. 2 are views showing the steps of a method for manufacturing a printed wiring board according to the first embodiment.
Figure 2B:
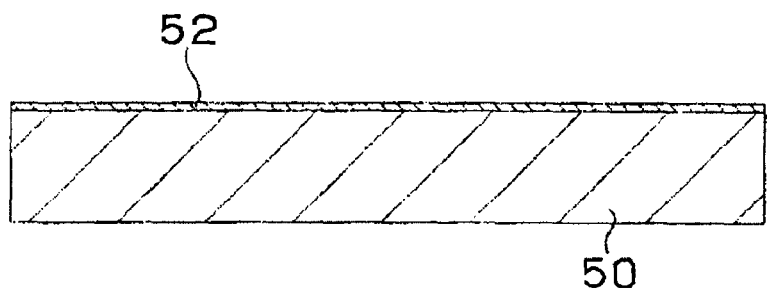

(1) On insulation layer 50 made of resin (FIG. 2A), metal film 52 made of copper or the like is formed (FIG. 2B). Such metal film may be formed by electroless copper plating. Here, instead of forming plated-metal film, metal foil may be laminated.

Figure 2C:
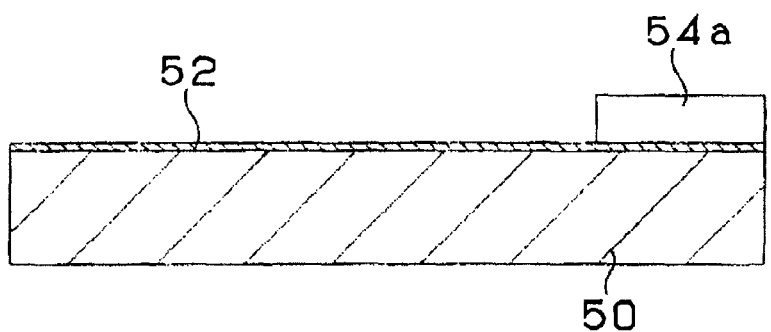
Figure 2D:
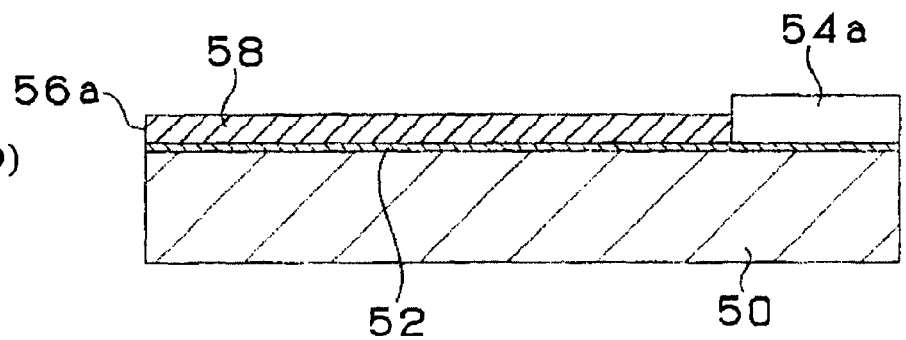

(2) First plating resist (54a) for forming a pad and conductive circuit is formed on metal film 52 (FIG. 2C). Then, the substrate is immersed in an electrolytic plating solution, and an electrical current is passed through metal film 52. Accordingly, first electrolytic copper-plated film (56a) is formed in the area where plating resist is not formed (FIG. 2D).

Figure 3A:
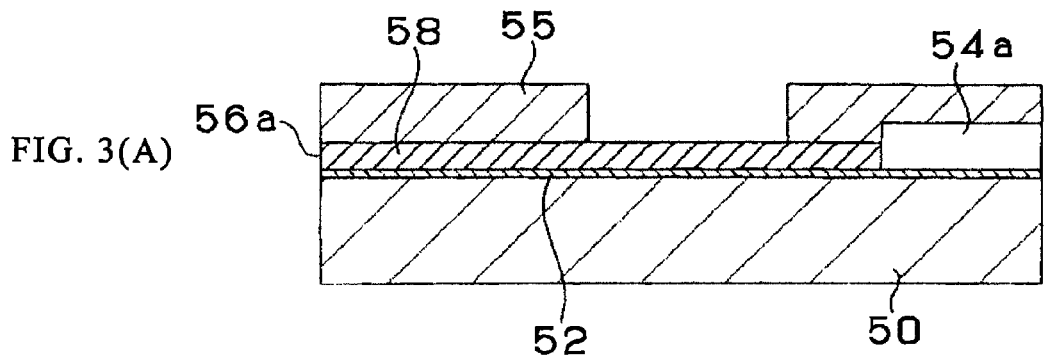
FIG. 3 are views showing the steps of a method for manufacturing a printed wiring board according to the first embodiment.
Figure 3B:
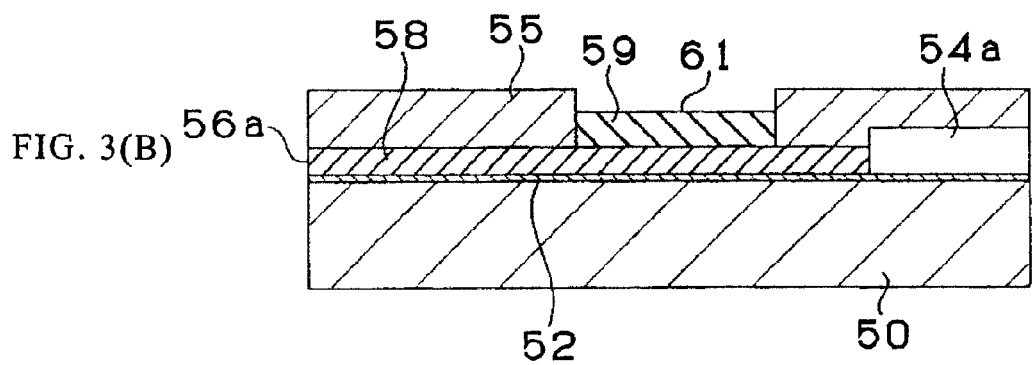

(3) Second plating resist 55 for forming a pad is formed on first electrolytic copper-plated film (56a), which will become conductive circuit (FIG. 3A). The substrate is immersed in an electrolytic plating solution, and second electrolytic copper-plated film 59 with a thickness of 2-10 μm is formed on the area of first electrolytic copper-plated film (56a) where second plating resist 55 is not formed (FIG. 3B).

Figure 3C:
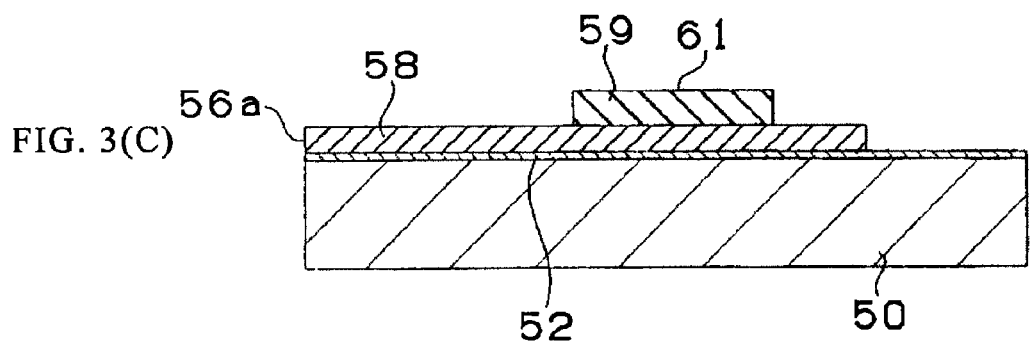
Figure 3D:
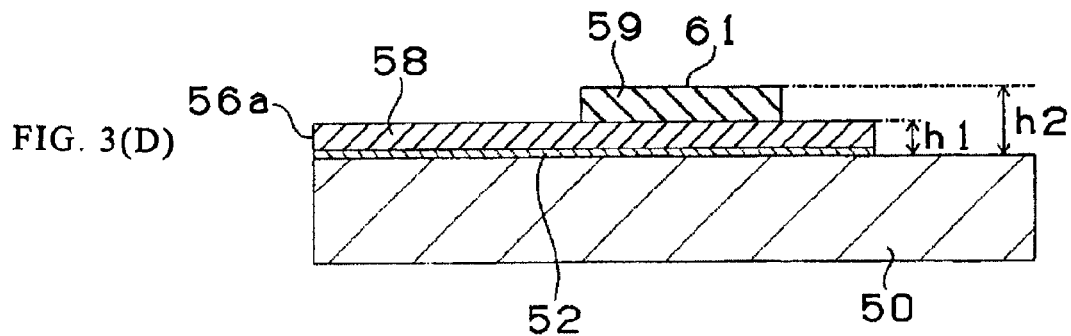

(4) First plating resist (54a) and second plating resist 55 are removed and the following are formed: conductive circuit 58 made from first electrolytic copper-plated film (56a), and pad 61 made up of first electrolytic copper-plated film (56a) and second electrolytic copper-plated film 59 formed on first electrolytic copper-plated film (56a) (FIG. 3C). Then, metal film 52 under first plating resist (54a) is removed by etching (FIG. 3D). In doing so, conductive circuit 58 with thickness (h1) of 15 μm and pad 61 with thickness (h2) of 18-25 μm are formed.

Figure 4A:
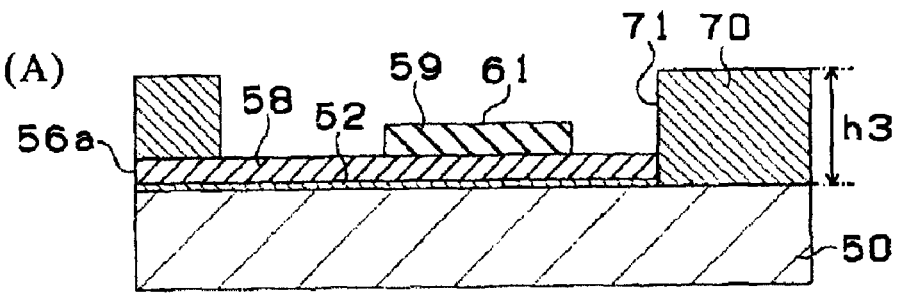
FIG. 4 are views showing the steps of a method for manufacturing a printed wiring board according to the first embodiment.

(5) On insulation layer 50, opening portion 71 exposing pad 61 is arranged and solder-resist layer 70 with thickness (h3) of 25-35 μm is formed (FIG. 4A). Here, opening portion 71 may expose the pad only, or may expose the surrounding portion of the pad as well.

Figure 4B:
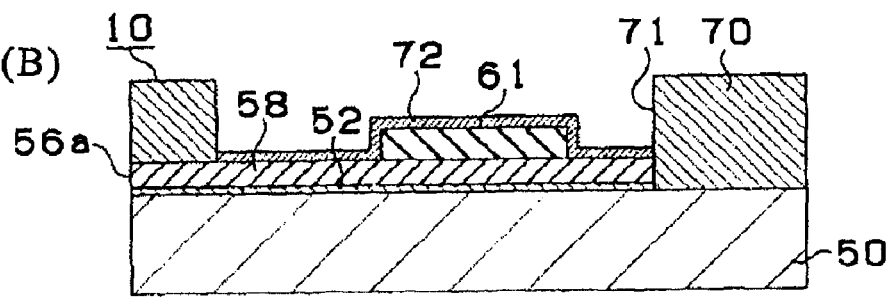

(6) On pad 61 exposed through opening portion 71, metal film 72 made of nickel-gold is formed (FIG. 4B). In doing so, printed wiring board 10 is completed.

In the following, mounting an IC chip on printed wiring board 10 is described.

Figure 4C:
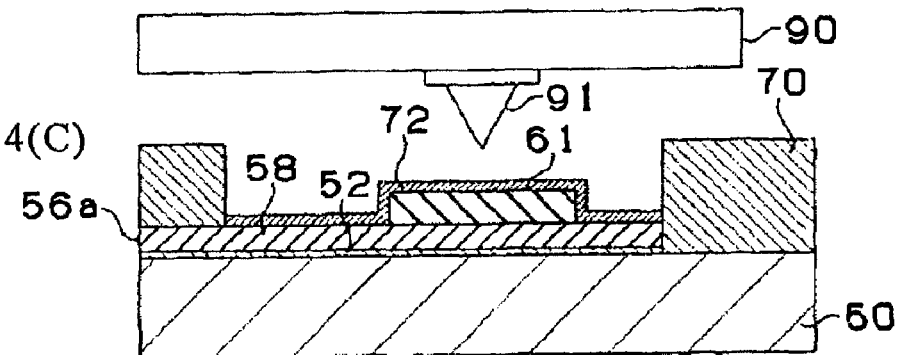
Figure 4D:
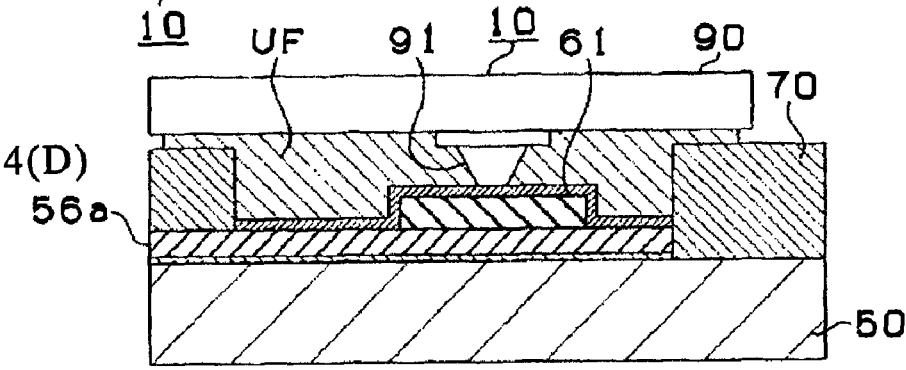
Figure 4E:
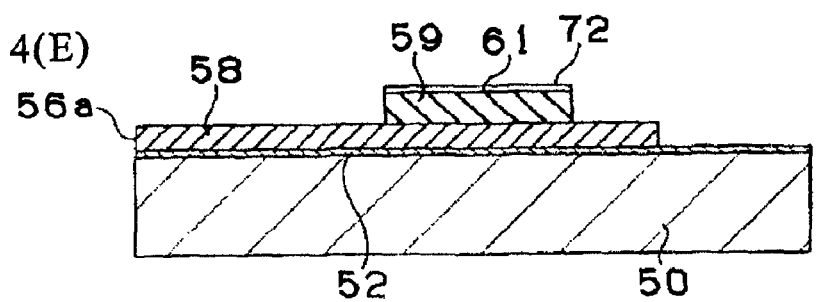

Gold-stud bump 91 of IC chip 90 to be mounted on the printed wiring board is aligned to face pad 61 of printed wiring board 10 (FIG. 4C). Then, IC chip 90 is pressed against printed wiring board 10, gold-stud bump 91 and pad 61 are connected, IC chip 90 is mounted on printed wiring board 10, and underfill (UF) is filled between IC chip 90 and printed wiring board 10 (FIG. 4D). In another example, metal film 72 made of nickel-gold may be formed after electrolytic copper-plated film 59 shown in FIG. 3B is formed. In such a case, a metal film is formed only on the top surface of the pad (FIG. 4E).

The thickness of pad 61 is preferred to be set lower than insulation layer 70. It is possible to form pad 61 to be thicker than insulation layer 70; however, since the mounting position of an electronic component rises, the pad is preferred to be set lower than the insulation layer from the viewpoint of making a lightweight and thinner type. For metal film 72, other than nickel and gold, a metal selected from among palladium, platinum, silver, lead, zinc and tin may be used.

In a printed wiring board according to the manufacturing method of the first embodiment, pad 61 is made up of first electrolytic copper-plated film (56a) and second electrolytic copper-plated film 59 with a thickness of 2-10 μm, and is 2-10 μm thicker than conductive circuit 58 made from first electrolytic copper-plated film (56a). Thus, when IC chip 90 is pressed against printed wiring board 10 to connect gold-stud bump 91 and pad 61, IC chip 90 does not come in contact with solder-resist layer 70. Accordingly, sufficient pressure may be exerted to enhance connection reliability between gold-stud bump 91 and pad 61. Also, since the thickness is increased by forming the second plated-metal film on the first plated-metal film, compared with a manufacturing method in which the thickness is reduced through etching using an etching resist, side etching will not occur on the pad and conductive circuit. Thus, connection reliability will not decrease in the pad and conductive circuit.

In a printed wiring board according to the manufacturing method of the first embodiment, metal film 72 is formed on pad 61, which is then connected to gold-stud bump 91. Since the pad is thick, heavy pressure may be exerted when gold-stud bump 91 is pressed against pad 61, leading to high connection reliability.

Moreover, in a printed wiring board according to the manufacturing method of the first embodiment, when gold-stud bump 91 is pressed against pad 61, even if solder-resist layer 70 comes in contact with IC chip 90, connection reliability may be enhanced, since pad 61 is thick and the pressure exerted on gold-stud bump 91 is heavy.

Second Embodiment

Printed wiring board 10 according to the second embodiment of the present invention is described with reference to FIGS. 5-7.

Figure 5A:
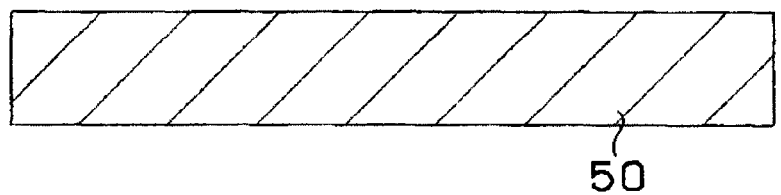
FIG. 5 are views showing the steps of a method for manufacturing a printed wiring board according to the second embodiment.
Figure 5B:
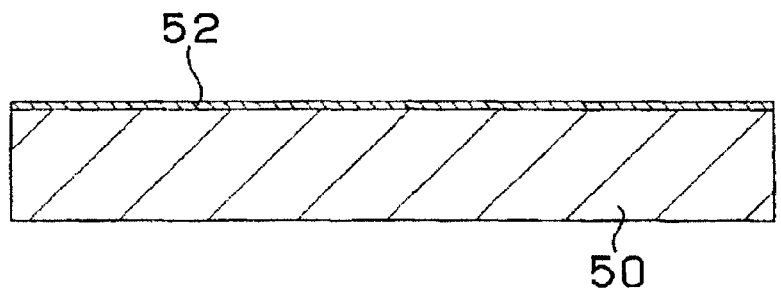

(1) On insulation layer 50 made of resin (FIG. 5A), metal film 52 made of copper or the like is formed (FIG. 5B). Such metal film may be formed by electroless copper plating. Here, instead of forming plated-metal film, metal foil may be laminated.

Figure 5C:
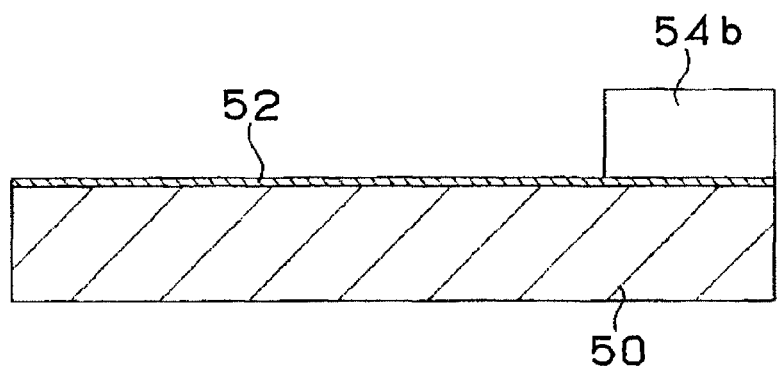
Figure 5D:
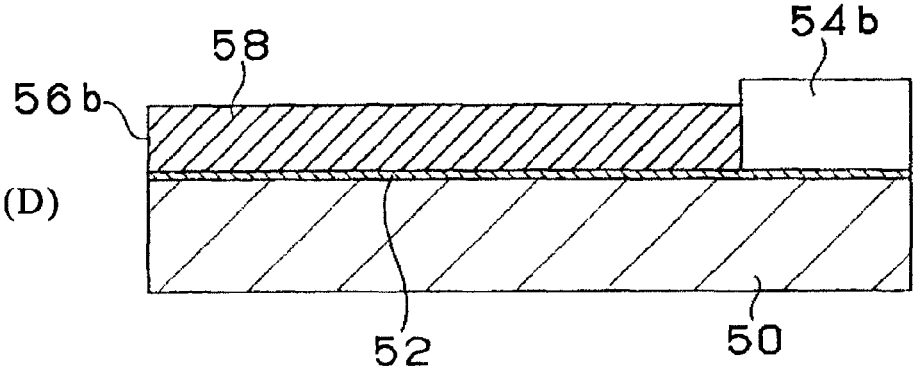

(2) Plating resist (54b) for forming a pad and conductive circuit is formed on metal film 52 (FIG. 5C). Then, the substrate is immersed in an electrolytic plating solution, and an electrical current is passed through metal film 52. Accordingly, electrolytic copper-plated film (56b) with a thickness of 18-25 μm is formed in the area where plating resist is not formed (FIG. 5D).

(3) Etching resist 57 is formed on the area of electrolytic copper-plated film (56b) that will become a pad (FIG. 6A). The substrate is immersed in an etchant, and portions of the surface of electrolytic copper-plated film (56b) where etching resist 57 is not formed are etched away by a thickness of 2-10 μm (FIG. 6B). The resultant portions will become conductive circuit.

(4) Plating resist (54b) and etching resist 57 are removed and the following are formed: conductive circuit 58 made from the portions of electrolytic copper-plated film (56b) which were etched by a thickness of 2-10 μm, and pad 61 made from the portion of electrolytic copper-plated film (56b) which was not etched (FIG. 6C). Then, metal film 52 under plating resist (54b) is removed by etching (FIG. 6D). By doing so, conductive wiring 58 with thickness (h1) of 15 μm and pad 61 with thickness (h2) in the range of 18-25 μm are formed.

(5) Opening portion 71 exposing pad 61 is arranged on insulation layer 50, and solder-resist layer 70 with thickness (h3) in the range of 25-35 μm is formed (FIG. 7A).

(6) On pad 61 exposed through opening portion 71, metal film 72 made of nickel-gold is formed (FIG. 7B). Accordingly, printed wiring board 10 is completed.

Next, mounting an IC chip on printed wiring board 10 is described.

Gold-stud bump 91 of IC chip 90 to be mounted on the printed wiring board is aligned to face pad 61 of printed wiring board 10 (FIG. 7C). Then, IC chip 90 is pressed against printed wiring board 10, gold-stud bump 91 and pad 61 are connected, IC chip 90 is mounted on printed wiring board 10, and underfill (UF) is filled between IC chip 90 and printed wiring board 10 (FIG. 7D).

In printed wiring board 10 according to the manufacturing method of the second embodiment, pad 61 is thicker than conductive circuit 58, whose thickness is etched away by 2-10 μm. Thus, when IC chip 90 is pressed against printed wiring board 10 to connect gold-stud bump 91 and pad 61, IC chip 90 does not come in contact with solder-resist 70, and connection reliability is enhanced between gold-stud bump 91 and pad 61 by exerting sufficient pressure. Also, during the etching, because plating resist (54a) remains on the side surface of pad 61 and the side surface of conductive circuit 58, side etching will not occur on pad 61 and conductive circuit 58. Thus, reliability will not decrease in the pad and wiring, compared with a manufacturing method in which side etching will occur during etching using an etching resist to reduce the thickness of the wiring.

Figure 10A:
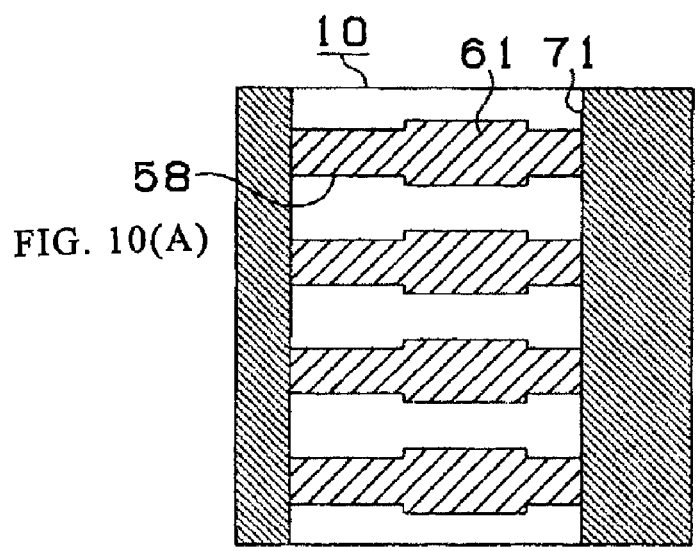
FIG. 10 are plan views showing modified examples of a printed wiring board according to an embodiment of the present invention.
Figure 10B:
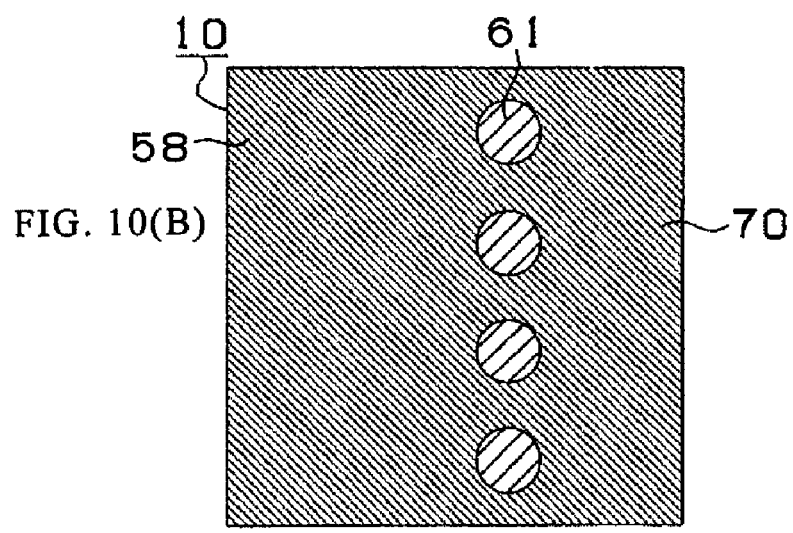
Figure 10C:
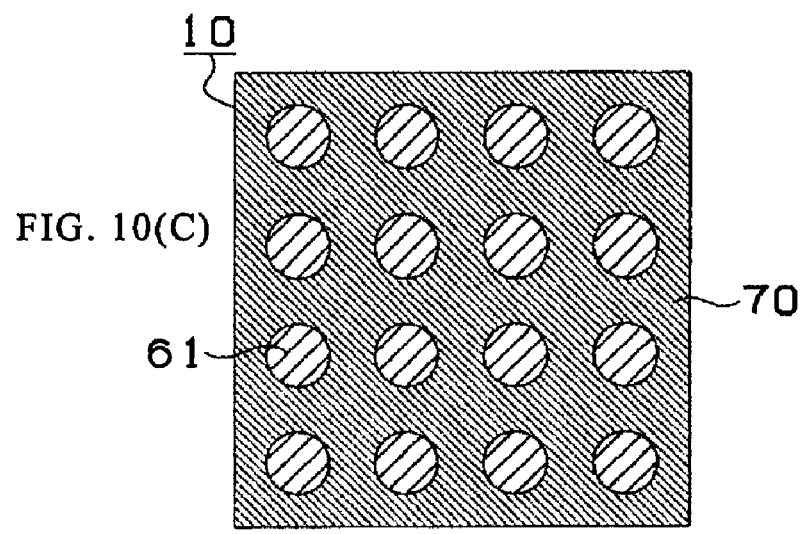

In printed wiring boards described in the first and second embodiment, the width of pads is not limited to those having the same width as the wiring. As shown in FIG. 10A, multiple rectangular pads 61 may be exposed through opening 71 arranged in solder-resist layer 70. Alternatively, as shown in FIG. 10B, pads 61 with a substantially circular shape may be formed. Also, as shown in FIG. 10C, only pads may be formed in a grid configuration and exposed through the solder-resist, which is higher than such pads.

Furthermore, as a modified example of the first embodiment, the following method may also be employed. FIG. 8A is a top view showing second plating resist 55 formed on printed wiring board 10. FIGS. 8B and 8C are cross-sectional views taken respectively from the (H1-H1') line and (W1-W1') line in FIG. 8A. Second plating resist 55 is formed to be narrower than the width of the first electrolytic copper-plated film. In such a case, pad 61 formed later will be set to be narrower than conductive circuit 58 both lengthwise and crosswise as shown in FIG. 8D.

Also, the following may be employed as a modified example of the Second Embodiment.

Figure 9A:
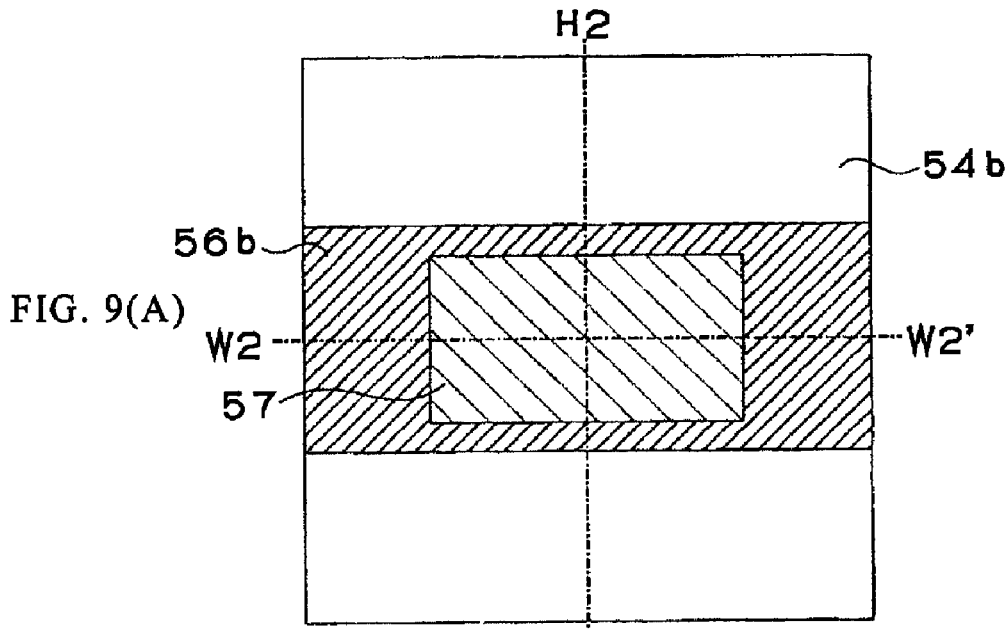
FIG. 9 are a top view and cross-sectional views showing a modified example of the multilayer printed wiring board according to the second embodiment.
Figure 9B:
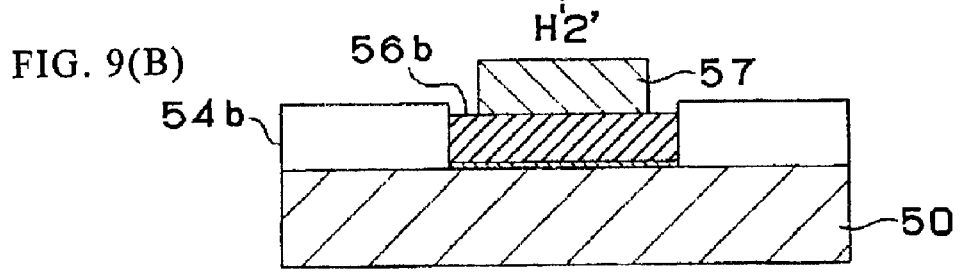
Figure 9C:
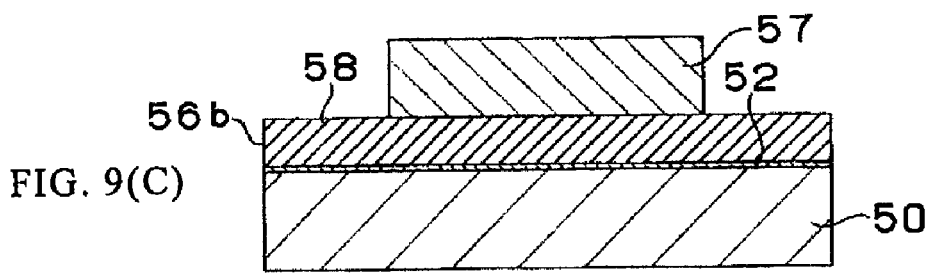
Figure 9D:
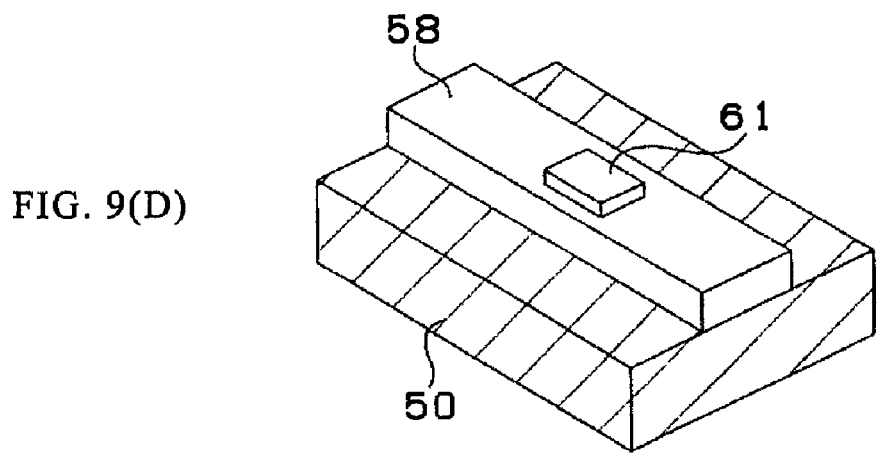

FIG. 9A is a top view showing etching resist 57 formed on the first electrolytic copper-plated film. FIGS. 9B and 9C are cross-sectional views taken respectively from the (H2-H2') line and (W2-W2') line in FIG. 9A. Etching resist 57 is formed to be narrower than the width of the first electrolytic copper-plated film. In such a case, pad 61 formed later will be set to be narrower than conductive circuit 58 both lengthwise and crosswise as shown in FIG. 9D.

Third Embodiment

A method for manufacturing printed wiring board 10 according to the third embodiment of the present invention is described with reference to FIGS. 11.

Using steps (1)-(4) of the first embodiment or steps (1)-(4) of the second embodiment, circuit 58 and pad 61, which is set to be 2-10 μm thicker than the circuit, are formed on insulation layer 50 (FIG. 11A). Then, anisotropic conductive film (ACF) 98, containing conductive particles made of metal or the like in resin film, is arranged on insulation layer 50, and printed wiring board 10 is completed (FIG. 11B).

Bump 92 of IC chip 90 to be mounted on a printed wiring board is aligned to face pad 61 of printed wiring board 10 (FIG. 11C). Then, IC chip 90 is pressed against printed wiring board 10, bump 92 and pad 61 are connected by means of ACF 98, and IC chip 90 is mounted on printed wiring board 10 (FIG. 11D).

Since pad 61 is thicker than circuit 58 in printed wiring board 10 of the third embodiment, only pad 61 makes connection with bump 92 by means of anisotropic conductive film (ACF) 98 without causing short-circuiting in circuit 58.

EXAMPLES

First Example

Figure 18A:
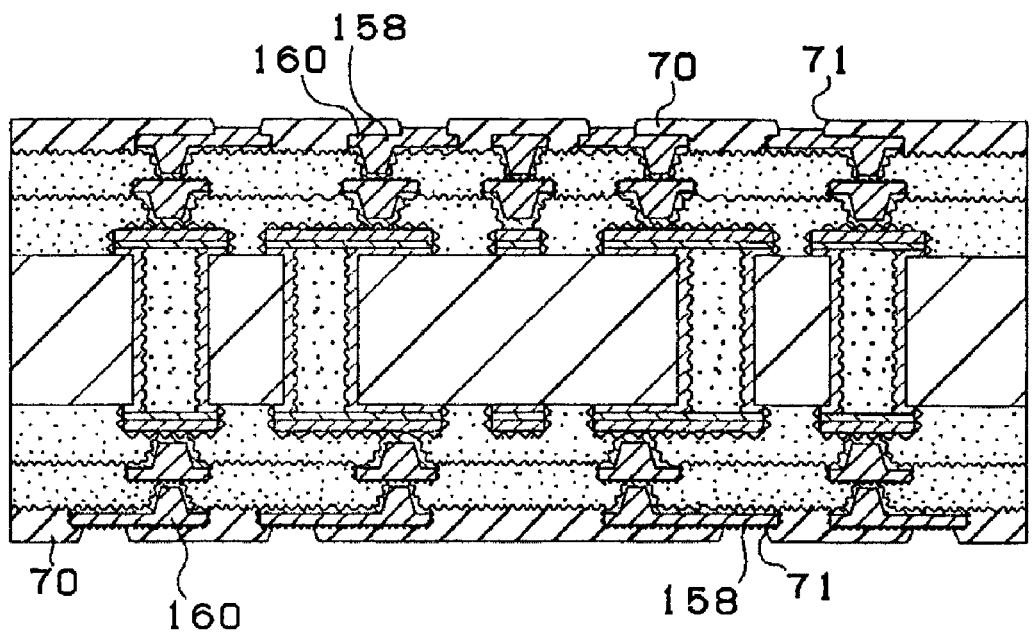
FIG. 18 are views showing the steps of a method for manufacturing a multilayer printed wiring board according to the first example of the present invention.
Figure 18B:
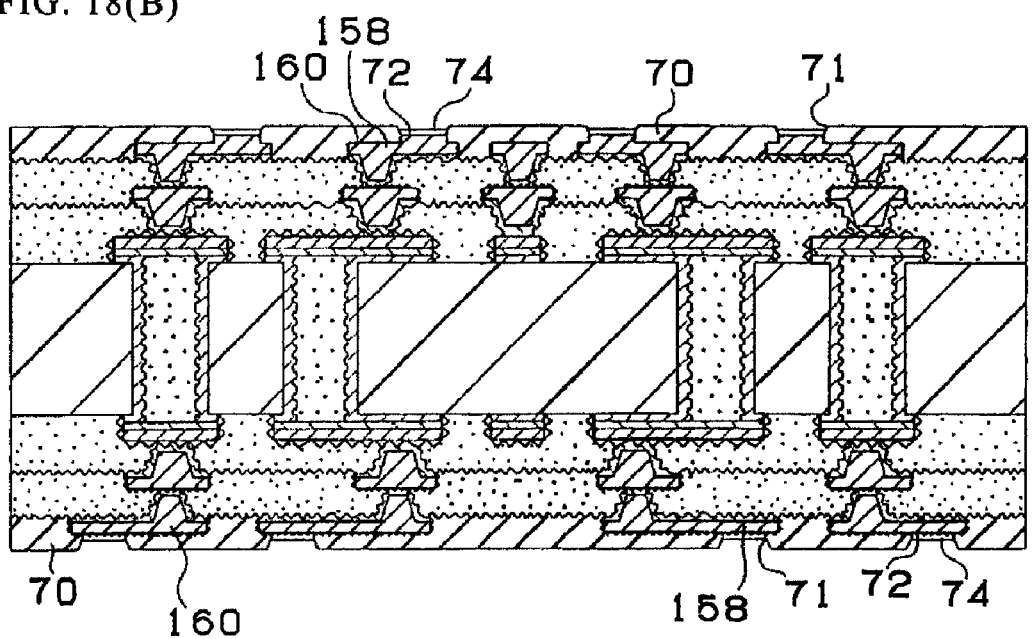
Figure 19:
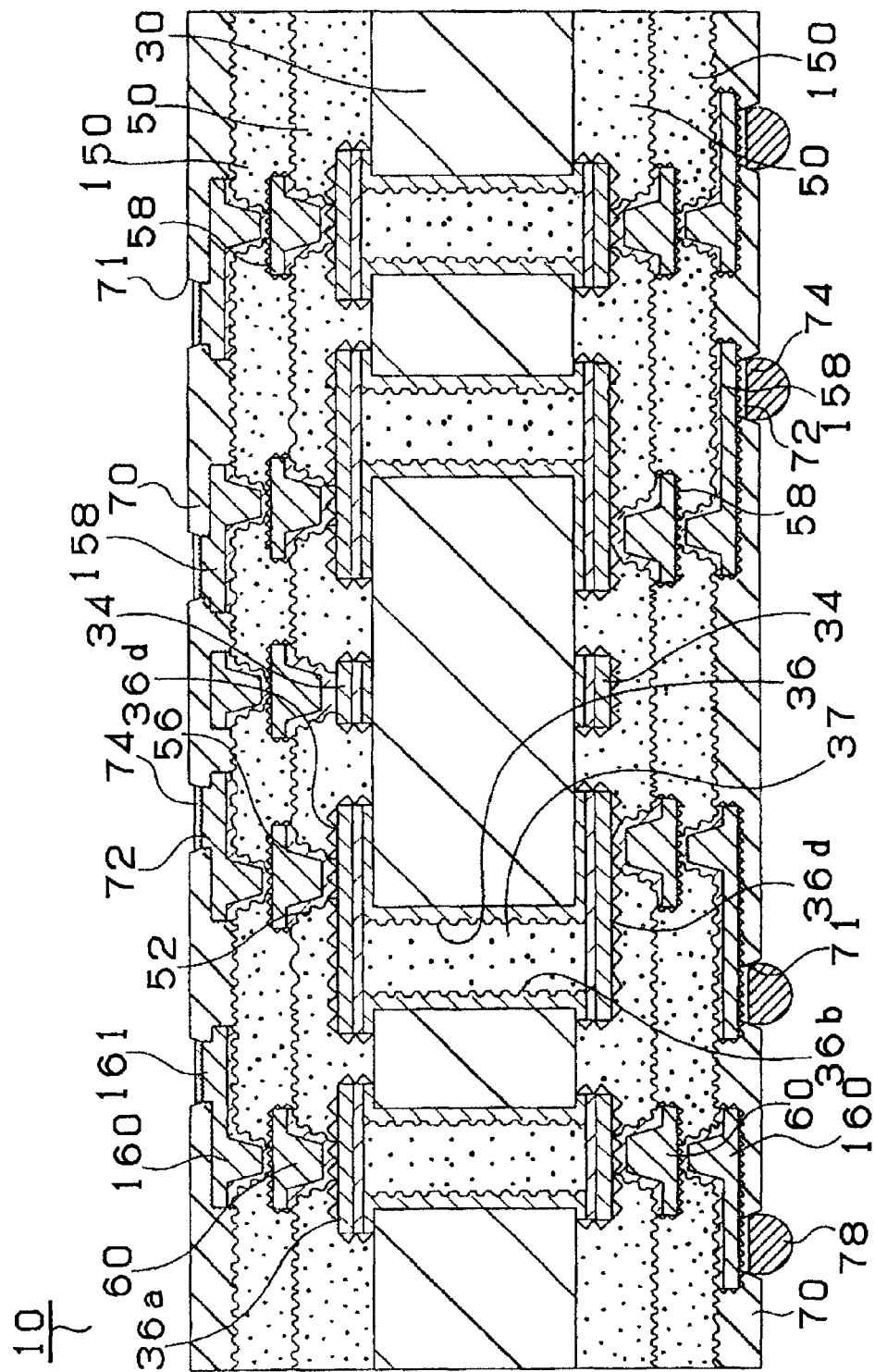
FIG. 19 is a cross-sectional view of a multilayer printed wiring board according to the first example.
Figure 20:
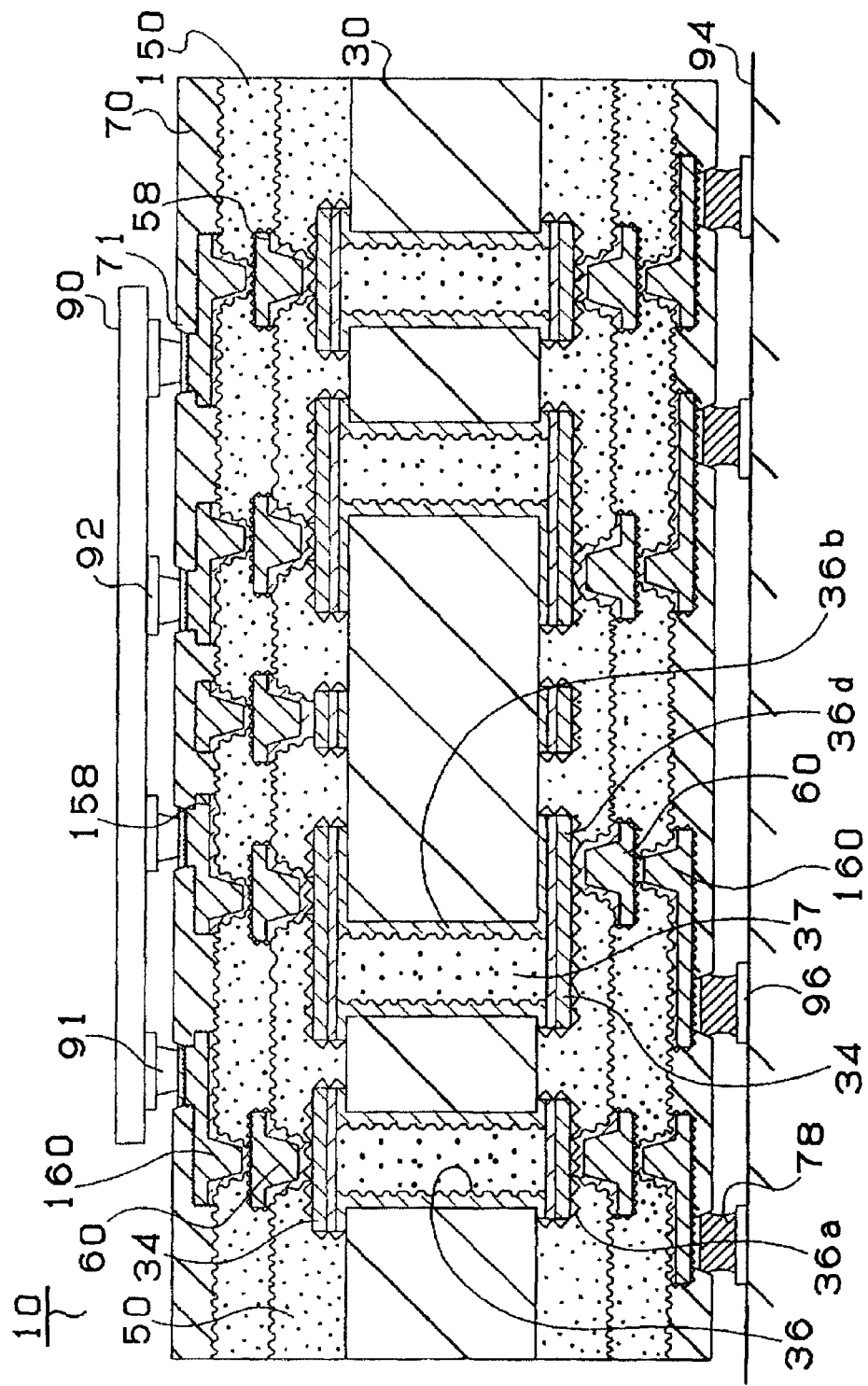
FIG. 20 is a cross-sectional view showing a state in which an IC chip is mounted on a multilayer printed wiring board according to the first embodiment.

The structure of built-up multilayer printed wiring board 10 according to the first example of the present invention is described with reference to FIGS. 12-20. FIG. 19 is a cross-sectional view showing multilayer printed wiring board 10, and FIG. 20 is a view showing a state in which IC chip 90 is mounted on multilayer printed wiring board 10 shown in FIG. 19, which is further mounted on daughterboard 94. As shown in FIG. 19, in multilayer printed wiring board 10, conductive circuits 34 are formed on the surfaces of core substrate 30. The front and back surfaces of core substrate 30 are connected by means of through-holes 36. Through-holes 36 are made up of plated cover layers (36a, 36d) which form through-hole lands and of side-wall conductive layers (36b). Resin filler 37 is filled in the interiors surrounded by side-wall conductive layers (36b). Resin insulation layers 50 having filled vias 60 and conductive circuits 58 and resin insulation layers 150 having filled vias 160 and conductive circuits 158 are formed on plated cover layers (through-hole lands) (36a, 36d). Pads 161 are formed at predetermined spots of upper-side conductive circuit 158. Solder-resist layers 70 are formed on resin insulation layers 150. Pads 161 are exposed through opening portions 71 of upper-side solder-resist layer 70; and bumps 78 are formed in lower-side opening portions 71.

As shown in FIG. 20, upper-side pads 161 of multilayer printed wiring board 10 are connected to bumps 92 of IC chip 90 by means of gold-stud bumps 91. Meanwhile, lower-side solder bumps 78 are connected to lands 96 of daughterboard 94.

Next, a method for manufacturing multilayer printed wiring board 10 described with reference to FIG. 20 is described by referring to FIGS. 12-19.

Figure 12A:
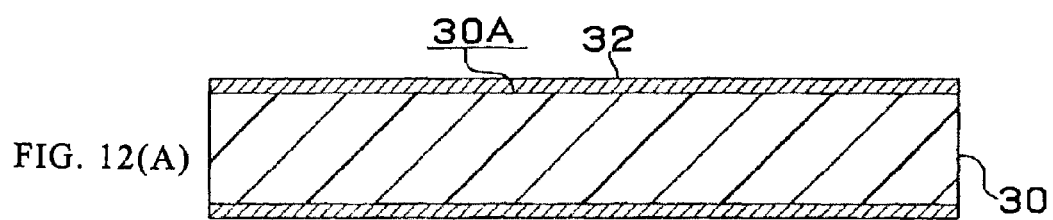
FIG. 12 are views showing the steps of a method for manufacturing a multilayer printed wiring board according to the first example of the present invention.
Figure 12B:
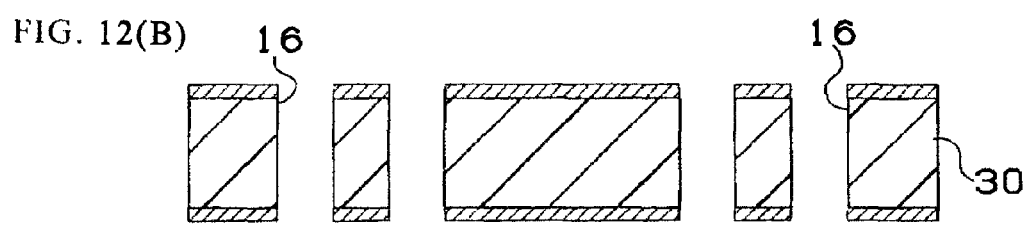
Figure 12C:
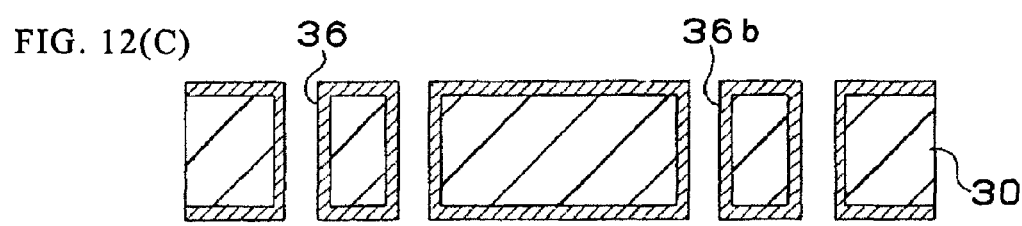

(1) Copper-clad laminate (30A) was prepared as a starting material. The copper clad-laminate was made by laminating copper foil 32 with a thickness of 5-250 μm on both surfaces of insulative substrate 30 made of glass-epoxy resin or bis-maleimide triazine (BT) resin with a thickness of 0.2-0.8 mm (FIG. 12A). First, by drilling the copper-clad laminate, penetrating holes 16 were formed (FIG. 12B). Then, side-wall conductive layers (36b) of through-holes 36 were formed by performing electroless plating and electrolytic plating (see later-described plating solution and conditions (steps (13)

and (15)) (FIG. 12C). The opening diameter of penetrating holes 16 was set at Φ0.1-0.25 mm by drill selection, and the pitch was set at 0.15-0.575 mm.

Figure 12D:
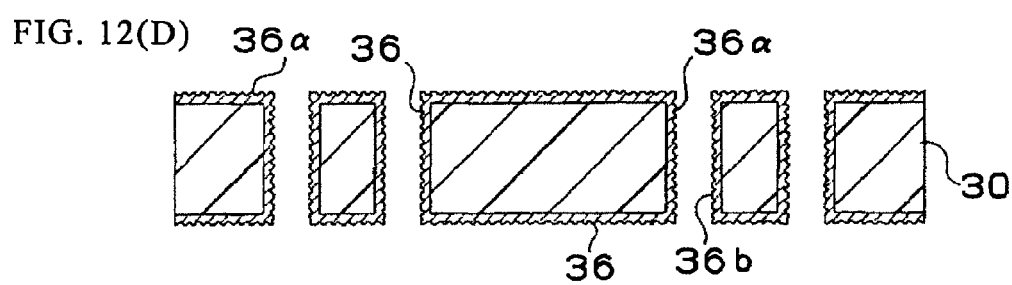

(2) Substrate 30 with through holes 36 was washed with water and dried, a black-oxide treatment was conducted using a solution containing NaOH (10 g/l), $NaClO_2$ (40 g/l) and $Na_3PO_4$ (6 g/l) as a black-oxide bath (oxidation bath), followed by a reduction treatment using a solution containing NaOH (10 g/l) and $NaBH_4$ (6 g/l) as a reduction bath. Accordingly, roughened surfaces (36αa) were formed on side-wall conductive layers (36b) of through-holes 36 and on the surfaces of the substrate (FIG. 12D).

(3) Next, filler 37 (non-conductive copper paste padding, brand name: DD paste, made by Tatsuta Electric Wire & Cable, Co., Ltd.) containing copper particles with an average particle diameter of 10 μm was filled in through-holes 36 by screen printing, dried and cured (FIG. 13A). A mask with openings corresponding to through-hole portions was placed on the substrate, and the paste was applied by printing to fill the through-holes. After that, the paste was dried and cured.

In the following, filler 37 bulging from through-holes 36 was removed by belt-sander polishing using #600 belt sanding paper (made by Sankyo-Rikagaku Co., Ltd.). Then, buff polishing to remove scratches from such belt sanding was conducted to level the surfaces of substrate 30 (see FIG. 13B). In doing so, substrate 30 was obtained where side-wall conductive layers (36b) of through-holes 36 and resin filler 37 were firmly adhered by means of roughened layer (36α).

(4) On the surfaces of substrate 30 leveled in step (3), palladium catalyst (made by Atotech) was applied and electroless copper plating was performed. Accordingly, electroless copper-plated films 23 with a thickness of 0.6 μm were formed (see FIG. 13C).

(5) Next, electrolytic copper plating was performed under the following conditions to form electrolytic copper-plated films 24 with a thickness of 15 μm. The portions that will become conductive circuits 34 were thickened, and the portions that will become plated cover layers (through-hole lands) to cover filler 37 filled in through-holes 36 were formed (FIG. 13D).

| [electrolytic plating solution] | |
|---|---|
| sulfuric acid | 180 g/l |
| copper sulfate | 80 g/l |
| additive (brand name: Cupracid GL, made by Atotech Japan) | 1 ml/l |
| [electrolytic plating conditions] | |
| current density | 1 A/dm$^2$ |
| time | 30 minutes |
| temperature | room temperature |

(6) On both surfaces of substrate 30 where portions that will become conductive circuits and plated-cover layers were formed, commercially available photosensitive dry film was laminated, and a patterned mask was placed on the film, which was then exposed to light at 100 mJ/cm$^2$ and developed with a 0.8% sodium carbonate solution. Accordingly, etching resists 25 with a thickness of 15 μm were formed (see FIG. 13E).

(7) Next, portions of plated-metal films (23, 24) and copper foil 32 where etching resist 25 was not formed were dissolved and removed by an etchant mainly containing copper (II) chloride. Then, etching resists 25 were removed by a 5% KOH solution. Accordingly, independent circuits 34 and plated-cover layers (36a, 36d) covering filler 37 were formed (see FIG. 14A). This process is a so-called tenting method.

Figure 14A:
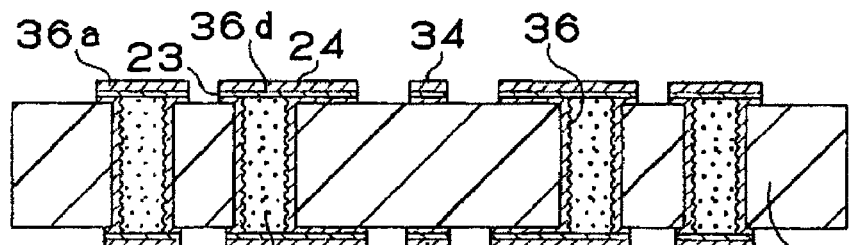
FIG. 14 are views showing the steps of a method for manufacturing a multilayer printed wiring board according to the first example of the present invention.
Figure 14B:
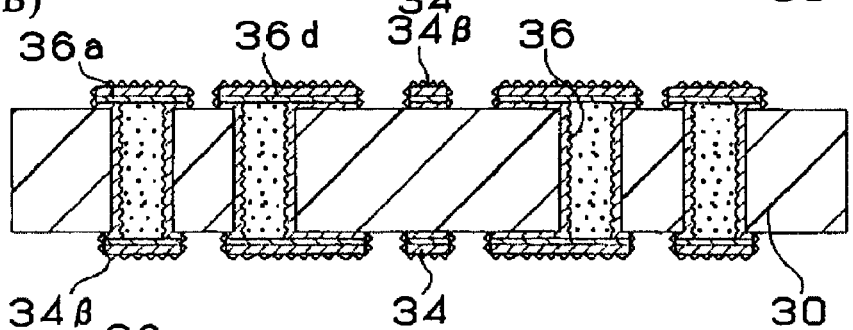

(8) Next, roughened layers (34β) were formed on the surfaces of conductive circuit 34 and plated-cover layers (36a, 36d) covering filler 37, using a micro etchant (CZ series) made by Mec Co., Ltd. (FIG. 14B).

Figure 14C:
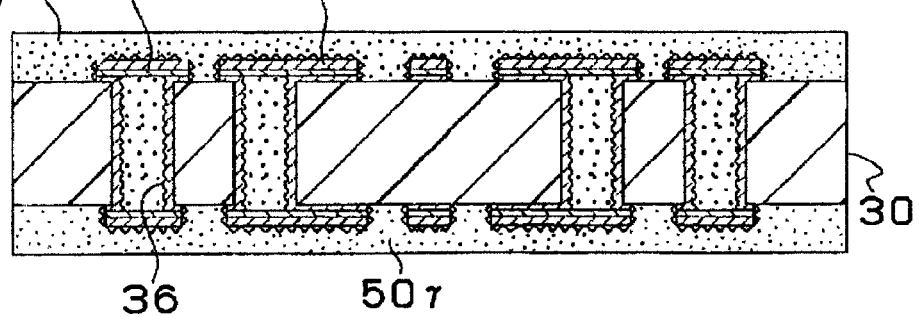

(9) On both surfaces of the substrate, resin film (50γ) for interlayer resin insulation layer (brand name ABF-45SH, made by Ajinomoto Fine-Techno Co., Inc.) with a slightly larger size than the substrate was placed and preliminarily pressed under the conditions of pressure 0.45 MPa, temperature 80° C. and pressing time 10 seconds, and cut to size. Then, by laminating the film using vacuum laminator equipment under the following conditions, resin insulation layers 50 were formed (FIG. 14C). Namely, the resin film for interlayer resin insulation layer on the substrate was given a final pressing under the conditions of vacuum degree 67 Pa, pressure 0.47 MPa, temperature 85° C. and pressing time 60 seconds, and then thermoset at 170° C. for 40 minutes.

Figure 14D:
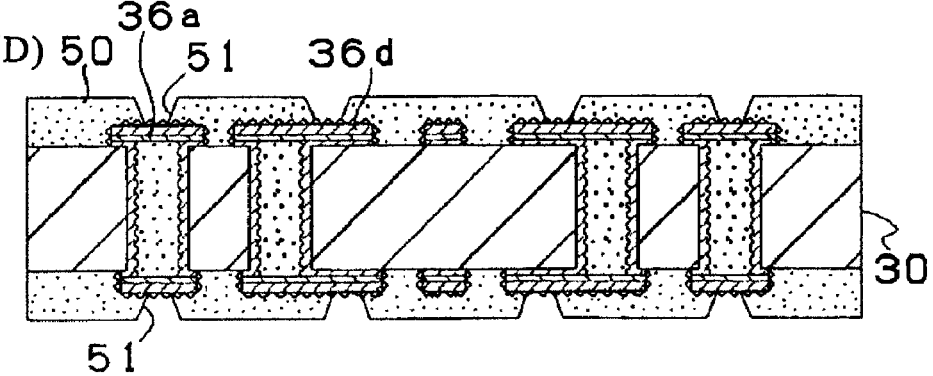

(10) Next, using a CO2 gas laser with a wave length of 10.4 μm, via hole openings 51 were formed in resin insulation layers 50 under the conditions of beam diameter 4.0 mm, top-hat mode, pulse width 3-30 μsec., mask through-hole diameter 1.0-5.0 mm and number of shots 1-3 (FIG. 14D). The above laser conditions were adjusted so that the bottom diameter of via holes in resin insulation layers 50 would become Φ60 μm. As a result, the bottom diameter of the via holes formed on plated-cover layers (36a, 36d) was made Φ60 μm.

Figure 15A:
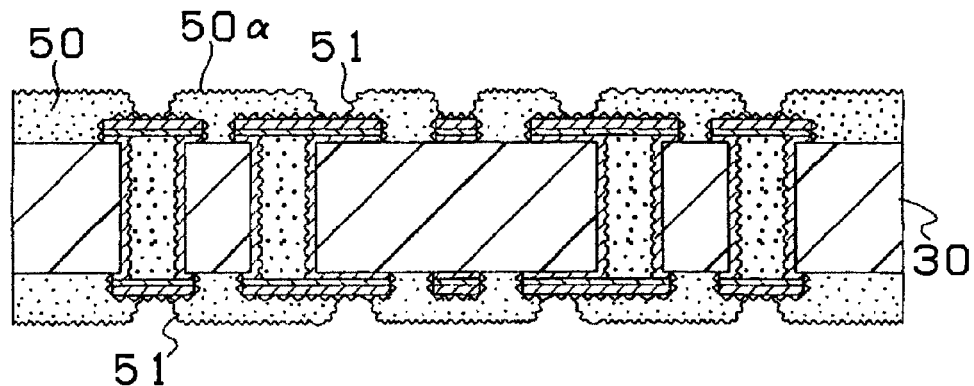
FIG. 15 are views showing the steps of a method for manufacturing a multilayer printed wiring board according to the first example of the present invention.

(11) The substrate with filled-via openings 51 was immersed for 10 minutes in an 80° C. solution containing permanganic acid 60 g/l, and epoxy-resin particles residing on the surfaces of resin insulation layers 50 were dissolved and removed. Accordingly, roughened surfaces (50α) were formed on the surfaces of resin insulation layers 50 including the inner walls of filled-via openings 51 (FIG. 15A).

(12) Next, after the above treatments, the substrate was immersed in a neutralizer (made by Shipley Company, LLC) and was washed with water. Furthermore, by applying palladium catalyst on the roughened surfaces (roughened depth 3 μm) of the substrate, catalyst nuclei were adhered to the surfaces of the resin insulation layers and the inner-wall surfaces of the filled-via openings. Namely, the substrate was immersed in a catalytic solution containing palladium chloride ($PbC_{12}$) and stannous chloride ($SnC_{12}$), and the catalyst was adhered to the surfaces through deposition of palladium metal.

Figure 15B:
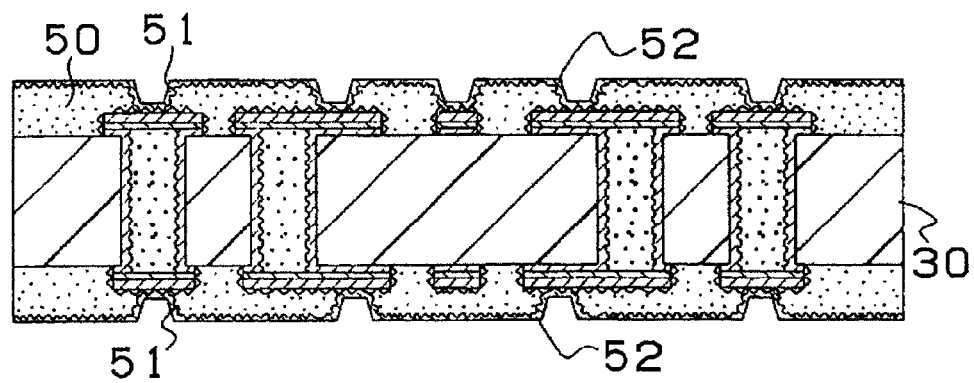

(13) Next, the substrate with applied catalyst was immersed in an electroless copper plating solution (Thru-Cup PEA) made by C. Uyemura & Co., Ltd. to form electroless copper-plated film with a thickness of 0.3-3.0 μm on the entire roughened surfaces. Accordingly, the substrate was obtained where electroless copper-plated film 52 was formed on the surfaces of resin insulation layers 50 including the inner walls of via-hole opening 51 (FIG. 15B).

[Electroless Plating Conditions]
Solution Temperature at 34° C. for 45 Minutes

Figure 15C:
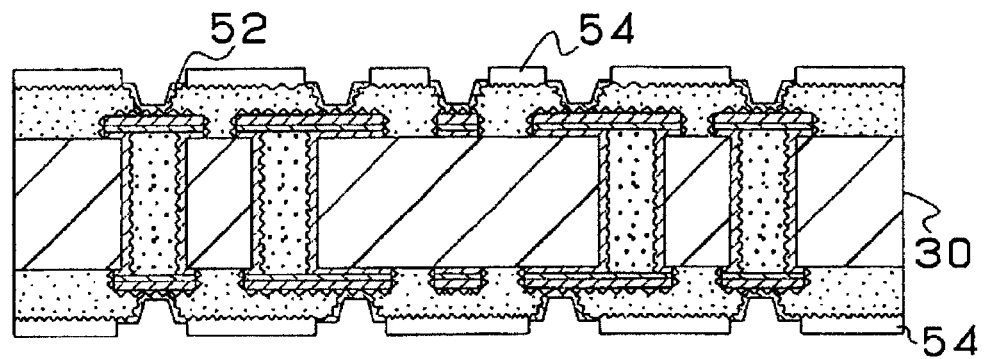

(14) On the substrate having electroless copper-plated film 52, commercially available photosensitive dry film was laminated, and a mask was placed on the film, which was then exposed to light at 110 mJ/cm$^2$ and developed with a 0.8% sodium carbonate solution. Accordingly, plating resists 54 with a thickness of 25 μm were formed (FIG. 15C).

(15) Then, after substrate 30 was cleansed with 50° C. water to degrease it and washed with 25° C. water, the substrate was further cleansed with sulfuric acid. Then, electrolytic plating was performed under the following conditions to form electrolytic plated-metal film 56 (FIG. 16A).

| [electrolytic plating solution] | |
|---|---|
| sulfuric acid | 2.24 mol/l |
| copper sulfate | 0.26 mol/l |
| additive | 19.5 ml/l |
| leveling agent | 50 mg/l |
| polishing agent | 50 mg/l |
| [electrolytic plating conditions] | |
| current density | 1 A/dm$^2$ |
| time | 70 minutes |
| temperature | 22 ± 2° C. |

(16) Furthermore, after plating resists 54 were removed using a 5% KOH solution, electroless plated-metal film under the plating resists was removed by etching using a mixed solution of sulfuric acid and hydrogen peroxide. Accordingly, independent conductive circuits 58 and filled vias 60 were formed (FIG. 16B).

(17) Next, by conducting the same treatment as in above step (4), roughened surfaces (58α) were formed on the surfaces of conductive circuits 58 and filled vias 60. The thickness of upper-layer conductive circuits 58 was 15 μm (FIG. 16C). However, the thickness of upper-layer conductive circuits may be set anywhere between 5 and 25 μm.

(18) By repeating steps (9)-(15), conductive circuits 158 and filled vias 160 made of electroless plated-metal film 152 and electrolytic plated-metal film 156 were formed in areas of upper-layer resin insulation layers 150 where plating resist 154 was not formed (FIG. 16D).

Figure 17A:
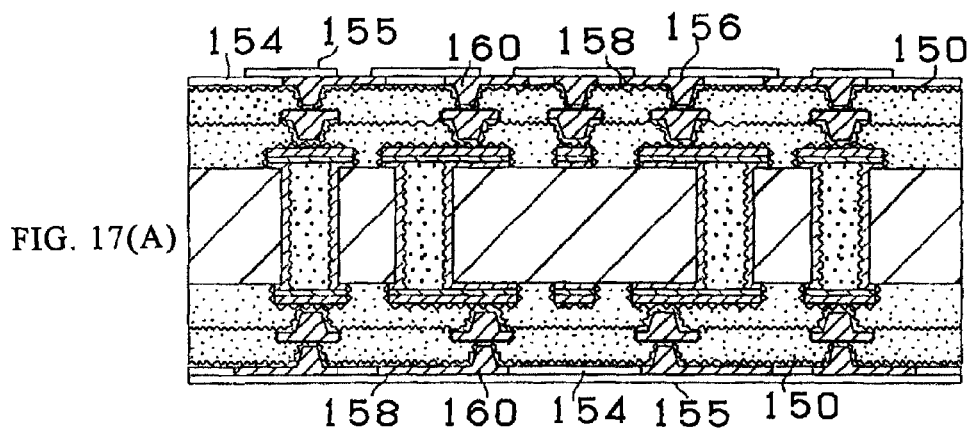
FIG. 17 are views showing the steps of a method for manufacturing a multilayer printed wiring board according to the first example of the present invention.

(19) Second plating resist 155 for forming pads was formed on copper-plated film 156 which will later become wiring circuits (FIG. 17A).

Figure 17B:
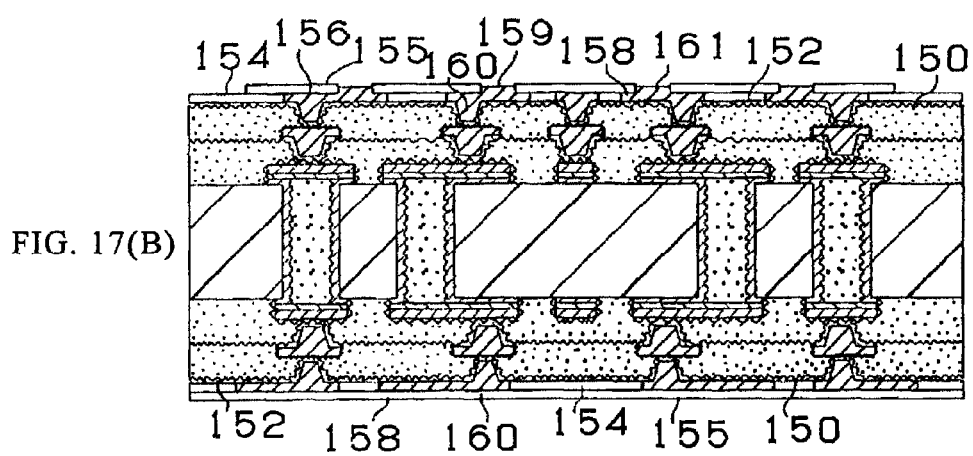

(20) The substrate was immersed in an electrolytic plating solution to form electrolytic copper-plated film 159 with a thickness of 2-10 μm on copper-plated film 156 in areas where second plating resist 155 was not formed (FIG. 17B).

Figure 17C:
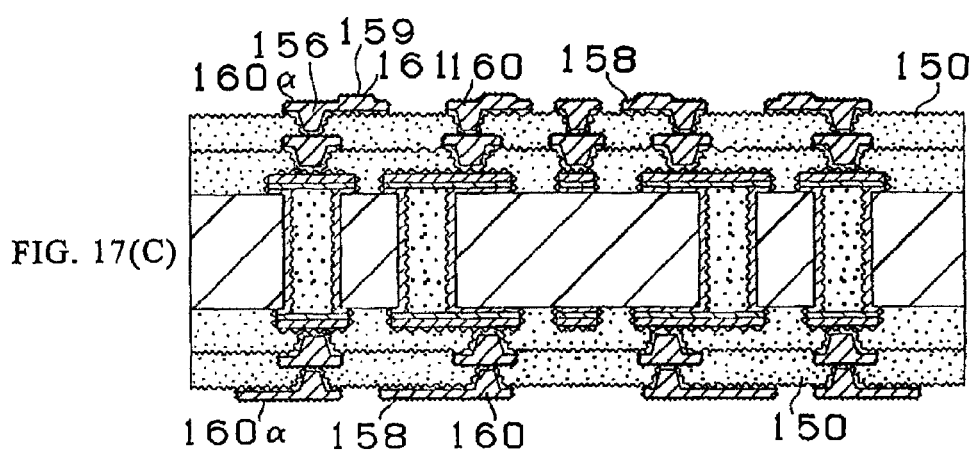

(21) Plating resists 154 and second plating resists 155 were removed, and pads 161 made from copper-plated film 159 were formed on circuit 158, which was made from copper-plated film 156. Then, metal film 152 under plating resists 154 was etched away and roughened layers (160α) were formed (FIG. 17C).

(22) Next, on both surfaces of a multilayer wiring substrate, a commercially available solder-resist composition 70 was applied to be 25-35 μm thick, which was then dried at 70° C. for 20 minutes and at 70° C. for 30 minutes. Then, a 5-mm thick photomask with a pattern of solder-resist openings was adhered to solder resist layers 70, which were then exposed to ultraviolet rays at 1000 mJ/cm$^2$ and developed using a DMTG solution. Accordingly, openings 71 were formed with a diameter of 200 μm (FIG. 18A). In addition, heat treatments were conducted at 80° C. for an hour, 100° C. for an hour, 120° C. for an hour and 150° C. for three hours to cure the solder-resist layers. Accordingly, solder-resist pattern layers having openings are formed with a thickness of 20-30 μm.

(23) Next, the substrate with solder-resist layers 70 was immersed for 20 minutes in an electroless nickel plating solution of pH=4.5 containing nickel chloride ($2.3 \times 10^{-1}$ mol/l), sodium hypophosphite ($2.8 \times 10^{-1}$ mol/l) and sodium citrate ($1.6 \times 10^{-1}$ mol/l); and a 0.5 μm-thick nickel-plated layer 72 was formed in opening portions 71. Furthermore, the substrate was immersed for 7.5 minutes at 80° C. in an electroless gold plating solution containing gold potassium cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l). Accordingly, a 0.03 μm-thick gold-plated layer 74 was formed on nickel-plated layer 72 (FIG. 18B). Other than a nickel-gold layer, a single layer of tin or a noble metal layer (gold, silver, palladium, platinum or the like) may be formed.

(24) After that, tin-antimony solder paste was printed in the openings of the lower-side solder-resist layer. Then, a reflow was conducted at 200° C. to form solder bumps (solder bodies). Accordingly, a multilayer printed wiring board having solder bumps 78 was manufactured (FIG. 19).

In the following, mounting an IC chip on multilayer printed wiring board 10 and further mounting the wiring board on a daughterboard are described.

Gold-stud bumps 91 of IC chip 90 to be mounted on the multilayer printed wiring board are aligned to face pads 161 of multilayer printed wiring board 10. Then, IC chip 90 is pressed against printed wiring board 10 to connect gold-stud bumps 91 and pads 161, and IC chip 90 is mounted on multilayer printed wiring board 10. Then, multilayer printed wiring board 10 is mounted on daughterboard 94 by means of solder bumps 78 (FIG. 20).

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board comprising:
    an insulative layer having a first surface and a second surface on an opposite side of the first surface;
    a wiring formed on the first surface of the insulative layer and having a pad and a conductive circuit contiguous to the pad, the pad being configured to mount an electronic component having a gold bump;
    a solder-resist layer formed on the first surface of the insulative layer and the wiring, the solder-resist layer having an opening portion in which the pad is formed; and
    a metal film formed on the pad and the conductive circuit, the conductive circuit being extended from underneath the pad in the opening portion such that the metal film is formed on a top surface of the pad, a top surface of the conductive circuit, and a side surface of the pad,
    wherein the pad has a thickness greater than a thickness of the conductive circuit, and the thickness of the pad is less than a thickness of the solder-resist layer.

2. The printed wiring board according to claim 1, wherein a width of the pad is substantially the same as a width of the conductive circuit.

3. The printed wiring board according to claim 1, wherein the thickness of the pad is 2-10 μm greater than the thickness of the conductive circuit.

4. The printed wiring board according to claim 1, wherein the metal film is formed on the pad and a portion of the conductive circuit contiguous to the pad and made of an electrolytic plated film.

5. The printed wiring board according to claim 1, wherein the metal film comprises at least one metal selected from the group consisting of Au, Ni, Pd, Pt, Pb, Ag, Sn and Zn.

6. The printed wiring board according to claim 1, wherein the conductive circuit comprises a first electrolytic plated film, the pad comprises a portion of the first electrolytic plated film and a second electrolytic plated film formed on the portion of the first electrolytic plated film, and the second electrolytic plated film is the electrolytic plated portion of the pad.

7. The printed wiring board according to claim 1, wherein the conductive circuit and the pad comprise an electrolytic plated film, and a portion of the electrolytic plated film is etched away such that the conductive circuit is formed.

8. The printed wiring board according to claim 1, further comprising an anisotropic conductive film formed over the pad.

9. The printed wiring board according to claim 1, wherein the metal film is a single layer comprising nickel and gold.

10. The printed wiring board according to claim 1, wherein the pad and the conductive circuit are made of copper.

* * * * *